(12) United States Patent
Balasekaran et al.

(10) Patent No.: US 10,600,927 B2
(45) Date of Patent: Mar. 24, 2020

(54) INFRARED DETECTING SEMICONDUCTOR DEVICE

(71) Applicant: SUMITOMO ELECTRIC INDUSTRIES, LTD., Osaka (JP)

(72) Inventors: Sundararajan Balasekaran, Osaka (JP); Hiroshi Inada, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 147 days.

(21) Appl. No.: 15/958,862

(22) Filed: Apr. 20, 2018

(65) Prior Publication Data
US 2018/0315872 A1   Nov. 1, 2018

(30) Foreign Application Priority Data
Apr. 26, 2017   (JP) .................... 2017-087359

(51) Int. Cl.
| | | |
|---|---|---|
| H01L 31/0304 | (2006.01) | |
| H01L 31/0216 | (2014.01) | |
| H01L 31/0224 | (2006.01) | |
| H01L 31/0352 | (2006.01) | |
| H01L 31/109 | (2006.01) | |

(52) U.S. Cl.
CPC .... *H01L 31/03046* (2013.01); *H01L 31/0224* (2013.01); *H01L 31/02162* (2013.01); *H01L 31/02164* (2013.01); *H01L 31/022408* (2013.01); *H01L 31/03042* (2013.01); *H01L 31/035236* (2013.01); *H01L 31/109* (2013.01)

(58) Field of Classification Search
CPC ............. H01L 31/02327; H01L 31/105; H01L 31/035236; H01L 31/03046; H01L 2224/48091
See application file for complete search history.

(56) References Cited

U.S. PATENT DOCUMENTS

2014/0312303 A1* 10/2014 Klipstein ............ H01L 27/1443
257/21

OTHER PUBLICATIONS

Chen, Baile, et al., "SWIR/MWIR InP-Based p-i-n Photodiodes with InGaAs/GaAsSb Type-II Quantum Wells", *IEEE Journal of Quantum Electronics*, vol. 47, No. 9, Sep. 2011.

* cited by examiner

*Primary Examiner* — Tony Tran
(74) *Attorney, Agent, or Firm* — Smith, Gambrell & Russell, LLP

(57) ABSTRACT

An infrared detecting semiconductor device comprises: an optical absorbing layer of type-II disposed between first conductivity-type and second conductivity-type semiconductor layers; and an optical filtering film of n-type InGaAs having an n-type dopant concentration larger than $8 \times 10^{17}$ cm$^{-3}$. The optical filtering film includes first to third semiconductor regions, which are sequentially arranged in a direction of a first axis on the optical filtering film. The first semiconductor region has an n-type dopant concentration of $2.0 \times 10^{19}$ cm$^{-3}$ or more. The third semiconductor region has a n-type concentration of $3.0 \times 10^{18}$ cm$^{-3}$ or less. The second semiconductor region has an n-type dopant profile monotonically changing from a first dopant concentration at a boundary between the first and second semiconductor regions to a second dopant concentration at a boundary between the second and third semiconductor regions. The first dopant concentration is greater than the second dopant concentration.

5 Claims, 17 Drawing Sheets

INFRARED DETECTING SEMICONDUCTOR DEVICE

BACKGROUND OF THE INVENTION

Field of the Invention

The present invention relates to an infrared detecting semiconductor device. This application claims the benefit of priority from Japanese Patent application No. 2017-087359 filed on Apr. 26, 2017, which is herein incorporated by reference in its entirety.

Related Background Art

Baile Chen, Weiyang Jiang, Jinrong Yuan, Archie L. Holmes, Jr., and Bora. M. Onat, "SWIR/MWIR InP-Based Pin Photodiodes with InGaAs/GaAsSb Type-II Quantum Wells," IEEE JOURNAL OF QUANTUM ELECTRONICS, VOL. 47, NO. 9, SEPTEMBER 2011 discloses a photodiode which receives light in short-wavelength and mid-wavelength infrared region.

SUMMARY OF THE INVENTION

An infrared detecting semiconductor device according to one aspect of the present invention comprises: a supporting base transmissive to light in infrared wavelengths; a first conductivity-type semiconductor layer; a second conductivity-type semiconductor layer; an optical absorbing layer of type-II disposed between the first conductivity-type semiconductor layer and the second conductivity-type semiconductor layer; and an optical filtering film of n-type InGaAs having an n-type dopant concentration larger than $8\times10^{17}$ $cm^{-3}$, the optical absorbing layer, the optical filtering film, and the supporting base being sequentially arranged in a direction of a first axis, the optical filtering film including a first semiconductor region, a second semiconductor region, and a third semiconductor region, the first semiconductor region, the second semiconductor region, and the third semiconductor region being sequentially arranged in the direction of the first axis on the optical filtering film, the first semiconductor region having an n-type dopant concentration of $2.0\times10^{19}$ $cm^{-3}$ or more, the third semiconductor region having a n-type concentration of $3.0\times10^{18}$ $cm^{-3}$ or less, the second semiconductor region having a first dopant concentration at a boundary between the first semiconductor region and the second semiconductor region, and having a second dopant concentration at a boundary between the second semiconductor region and the third semiconductor region, and the first dopant concentration being greater than the second dopant concentration, and the second semiconductor region including a part with an n-type dopant profile monotonically changing from the first dopant concentration to the second dopant concentration.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Figure 1:
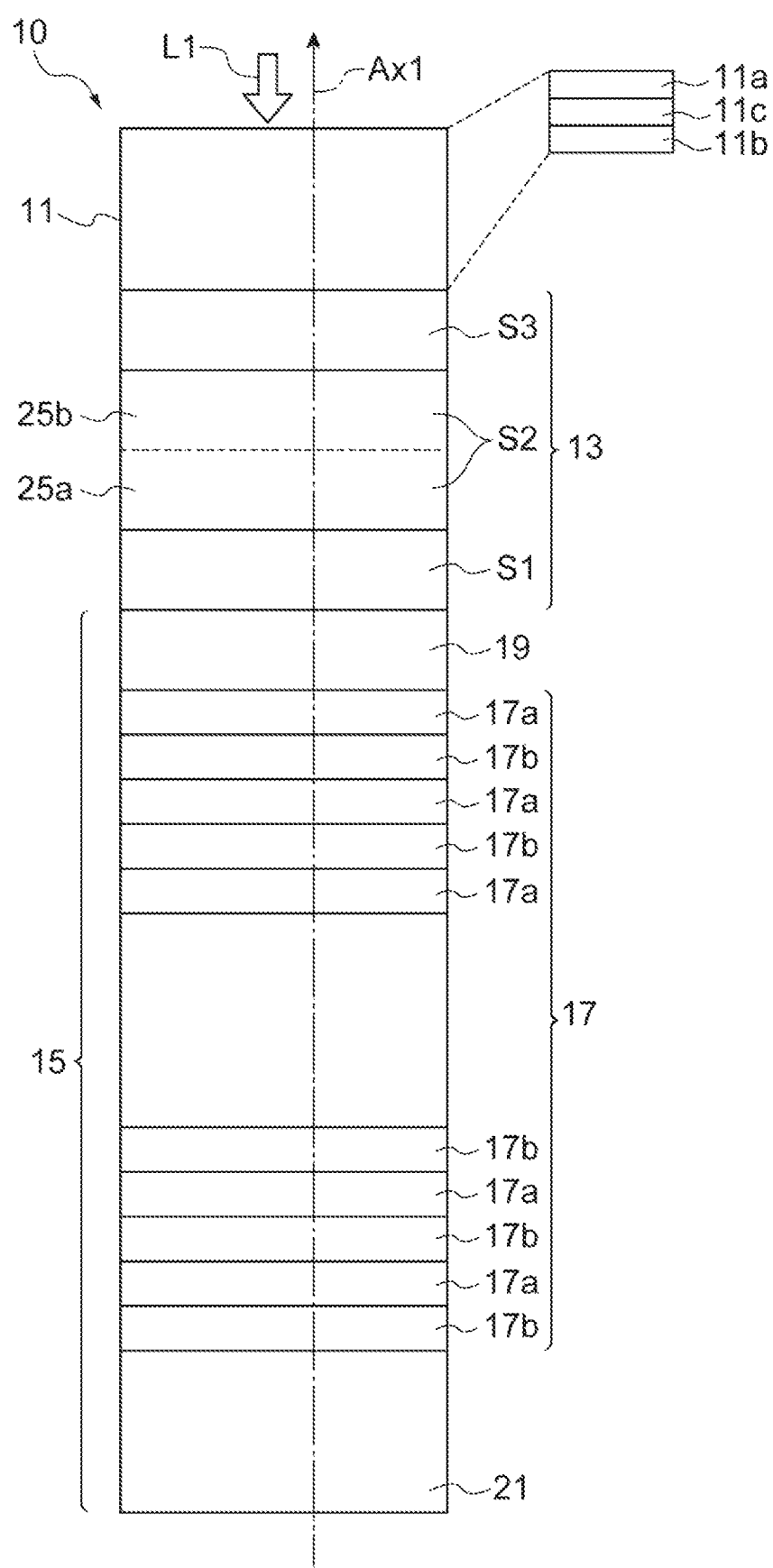
FIG. 1 is a schematic view showing a semiconductor laminate structure of an infrared detecting semiconductor device according to the present embodiment.

The InGaAs/GaAsSb superlattice is responsive to light in a wavelength range of 1.3 to 2.5 micrometers. Inventors' findings reveals that improvement of optical response characteristics in the above wavelength range in terms of difference in sensitivity between wavelengths may expand the application of a semiconductor detecting device, such as a photodiode of InGaAs/GaAsSb superlattice.

It is an object of one aspect of the present invention to provide an infrared detecting semiconductor device including an optical filter that can compensate for optical response characteristics of the light absorbing layer thereof.

Embodiments according to the above aspect will be described below.

An infrared detecting semiconductor device according to an embodiment comprises: (a) a supporting base transmissive to light in infrared wavelengths; (b) a first conductivity-type semiconductor layer; (c) a second conductivity-type semiconductor layer; (d) an optical absorbing layer of type-II disposed between the first conductivity-type semiconductor layer and the second conductivity-type semiconductor layer; and (e) an optical filtering film of n-type InGaAs having an n-type dopant concentration larger than $8 \times 10^{17}$ $cm^{-3}$, the optical absorbing layer, the optical filtering film, and the supporting base being sequentially arranged in a direction of a first axis, the optical filtering film including a first semiconductor region, a second semiconductor region, and a third semiconductor region, the first semiconductor region, the second semiconductor region, and the third semiconductor region being sequentially arranged in the direction of the first axis on the optical filtering film, the first semiconductor region having an n-type dopant concentration of $2.0 \times 10^{19}$ $cm^{-3}$ or more, the third semiconductor region having a n-type concentration of $3.0 \times 10^{18}$ $cm^{-3}$ or less, the second semiconductor region having a first dopant concentration at a boundary between the first semiconductor region and the second semiconductor region, and having a second dopant concentration at a boundary between the second semiconductor region and the third semiconductor region, and the first dopant concentration being greater than the second dopant concentration, and the second semiconductor region including a part with an n-type dopant profile monotonically changing from the first dopant concentration to the second dopant concentration.

In the infrared detecting semiconductor device, InGaAs having an n-type dopant concentration larger than $8.0 \times 10^{17}$ $cm^{-3}$ causes the Moss-Burstein effect, which can provide thus-doped InGaAs with an optical transition forbidden band larger than the inherent bandgap of the host semiconductor, InGaAs, and has an optical transmittance higher than that of undoped InGaAs or lightly-doped InGaAs in a wavelength band of light that the undoped InGaAs and the lightly-doped InGaAs absorb. The InGaAs that has an n-type dopant concentration larger than $8.0 \times 10^{17}$ $cm^{-3}$ has a width of the optical transition forbidden band which depends upon the dopant concentration. The filtering film includes multiple semiconductor regions having different n-type dopant concentrations in a concentration range of greater than $8.0 \times 10^{17}$ $cm^{-3}$, and these semiconductor regions have respective light absorption characteristics depending on their dopant concentrations. These light absorption characteristics of the semiconductor regions of the filtering film each determine the amount of light incident on the light absorbing layer, and the optical response of the infrared detecting semiconductor device depends upon both the optical response characteristics of the light absorbing layer and the light transmission characteristics of the optical filtering film. As seen from the above, InGaAs of an n-type dopant concentration greater than $8.0 \times 10^{17}$ $cm^{-3}$ can provide the infrared detecting semiconductor device with an adjusted optical response property.

The infrared detecting semiconductor device according to an embodiment, the first semiconductor region, the second semiconductor region, and the third semiconductor region of the optical filtering film having a first cross-sectional area, a second cross-sectional area and a third cross-sectional area, respectively, the first cross-sectional area being greater than the second cross-sectional area, the second cross-sectional area being greater than the third cross-sectional area, and the first cross-sectional area, the second cross-sectional area and the third cross-sectional area each being defined on a plane intersecting the first axis.

In the infrared detecting semiconductor device, the lightest-doped third semiconductor region having the smallest cross-sectional area in the filter film absorbs light in long to short wavelengths of the entire sensitive wavelength range of the infrared detecting semiconductor device; the medium-doped second semiconductor region having a cross sectional area larger than that of the third semiconductor region in the optical filtering film absorbs light in medium to short wavelengths region of light of the entire sensitive range of the infrared detecting semiconductor device; and the heaviest-doped first semiconductor region having a cross sectional area larger than that of the second semiconductor region absorbs light in short wavelength wavelengths in the entire sensitive range of the infrared detecting semiconductor device.

The infrared detecting semiconductor device according to an embodiment, the optical absorbing layer has an InGaAs/GaAsSb quantum well structure.

The infrared detecting semiconductor device enables optical response that characteristics of the light absorbing layer of the InGaAs/GaAsSb quantum well structure is adjusted.

The infrared detecting semiconductor device according to an embodiment further comprises: a first electrode in contact with the first conductivity-type semiconductor layer; and a second electrode in contact with the second conductivity-type semiconductor layer. The optical filtering film is in direct contact with the first conductivity-type semiconductor layer.

The infrared detecting semiconductor device may dispose the optical filtering film outside an electric propagation path for carriers, and this location of the optical filtering film allows the filtering film to have an n-type dopant profile defining the light absorption characteristics of the infrared detecting semiconductor device independent of electrical performances thereof.

The infrared detecting semiconductor device according to an embodiment, the first conductivity-type semiconductor layer includes an n-type InGaAs of an n-type dopant concentration of $8.0 \times 10^{17}$ $cm^{-3}$ or less.

In the infrared sensing semiconductor device, the n-type InGaAs filtering film with an n-type dopant concentration larger than $8.0 \times 10^{17}$ cm$^{-3}$ is disposed on an n-type InGaAs with an n-type dopant concentration of $8.0 \times 10^{17}$ cm$^{-3}$ or less.

Teachings of the present invention can be readily understood by considering the following detailed description with reference to the accompanying drawings shown as examples. Referring to the accompanying drawings, embodiments of an infrared detecting semiconductor device, and a method for fabricating an infrared detecting semiconductor device according to the present invention will be described below. To facilitate understanding, identical reference numerals are used, where possible, to designate identical elements that are common to the figures.

Figure 2:
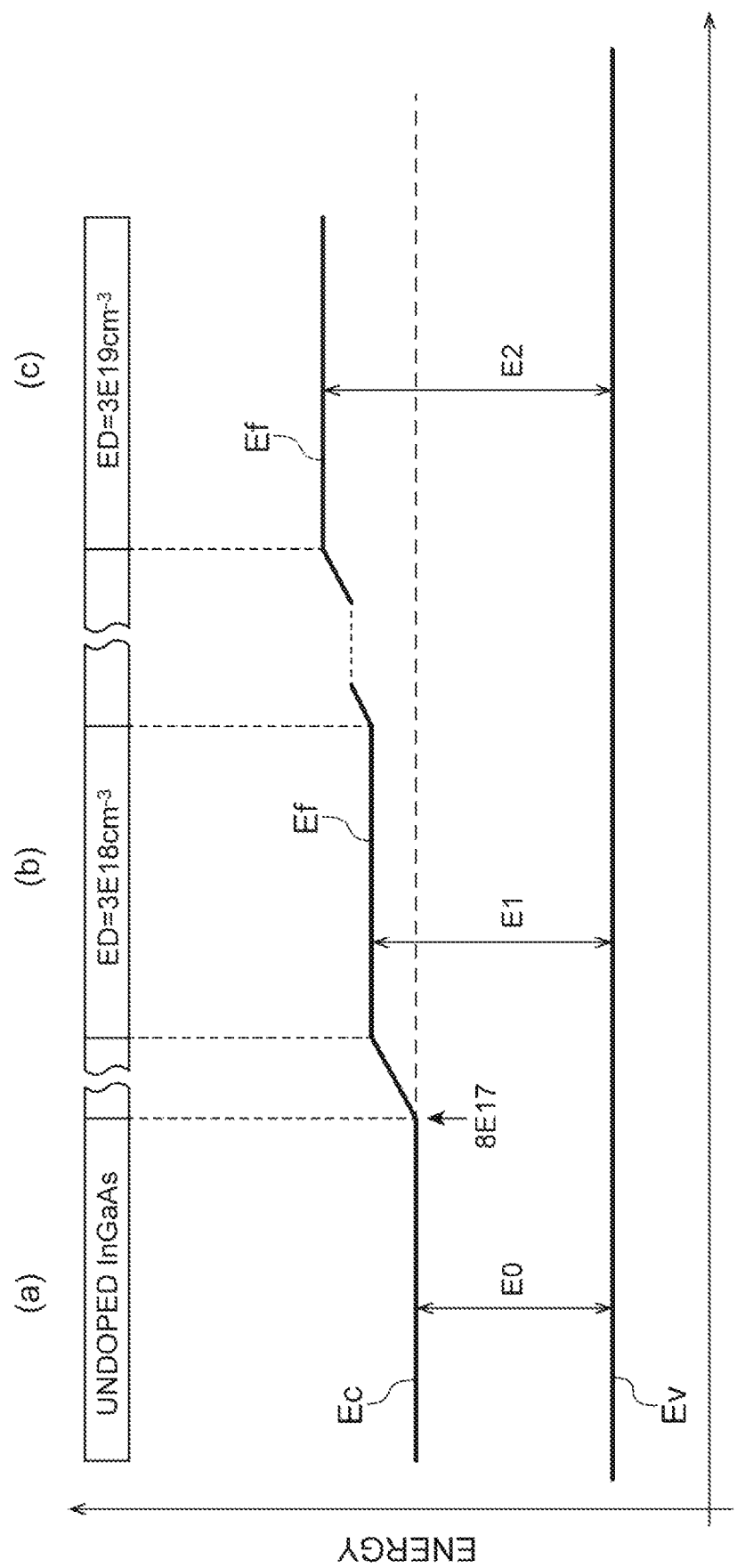
FIG. 2 is a drawing illustrating the relationship between the n-type dopant concentration in InGaAs and variation of band gap forbidding optical transition.

FIG. 1 is a schematic view showing a semiconductor laminate structure of an infrared detecting semiconductor device according to the embodiment. FIG. 2 is a schematic view illustrating the relationship between n-type dopant concentrations and light transition forbidden bands in InGaAs.

The infrared detecting semiconductor device 10 includes a supporting body 11, an optical filtering film 13, and a photodiode structure 15. The optical filtering film 13 is disposed between the supporting body 11 and the photodiode structure 15. The photodiode structure 15 includes a light absorbing layer 17, and the light absorbing layer 17 has a type-II superlattice structure. The optical filtering film 13 is made of n-type InGaAs, and has an n-type dopant concentration higher than $8.0 \times 10^{17}$ cm$^{-3}$ (abbreviated as "8.0E17 cm$^{-3}$"). In the infrared detecting semiconductor device 10, the light absorbing layer 17 is disposed between the first conductivity-type semiconductor layer 19 and the second conductivity-type semiconductor layer 21. The supporting body 11, the optical filtering film 13 and the light absorbing layer 17 are arranged in order along a direction of a first axis Ax1. The supporting body 11 is made of material capable of transmitting infrared rays in a wavelength range in which the light absorbing layer 17 exhibits photo response. The supporting body 11 may include, for example, a base 11a and a filling 11b. The base 11a can be made of material different from that of the substrate for epitaxial growth of semiconductor layers for the photodiode structure 15, and can be, for example, a silicon substrate or an InP substrate. The filling 11b may include a resin body, such as an epoxy resin. The supporting body 11 may further include a bonding layer 11c, which can bonds the optical filtering film 13 to the base 11a, and the bonding layer 11c may include an inorganic film, such as a silicon-based inorganic insulating material (for example, silicon oxide). Light passes through the supporting body 11, and then enters the light absorbing layer 17 through the optical filtering film 13.

The optical filtering film 13 includes a first semiconductor region 23, a second semiconductor region 25, and a third semiconductor region 27, which are arranged on the first conductivity-type semiconductor layer 19 along the direction of the first axis Ax1. The first semiconductor region 23 includes an n-type dopant concentration of 2.0E19 cm$^{-3}$ or more, and the third semiconductor region 27 has an n-type dopant concentration of 3.0E18 cm$^{-3}$ or less. The second semiconductor region 25 has an n-type dopant concentration of a first value (for example, less than 2.0E19 cm$^{-3}$) at the boundary between the first and second semiconductor regions 23 and 25, and has an n-type dopant concentration of a second value (for example, greater than 3.0E18 cm$^{-3}$) at the boundary with the second and third semiconductor regions 25 and 27. The second semiconductor region 25 has a portion in which the optical filtering film 13 has an n-type dopant profile monotonically changing from the first value to the second value in the direction from the first semiconductor region 23 to the third semiconductor region 27, and the n-type dopant profile may monotonically increase in the direction from the light absorbing layer 17 to the optical filtering film 13. The first semiconductor region 23 has an n-type dopant concentration of 2.0E19 cm$^{-3}$ or more at the boundary between the first and second semiconductor regions 23 and 25, and the third semiconductor region 27 has an n-type dopant concentration of 3.0E19 cm$^{-3}$ or less at the boundary between the second and third semiconductor regions 25 and 27. The second semiconductor region 25 has a portion in which the n-type dopant profile of the optical filtering film 13 monotonically changes in the direction from the first semiconductor region 23 to the third semiconductor region 27 in the range of 3.0E18 cm$^{-3}$ or more and 2.0 E19 cm$^{-3}$ or less, and the n-type dopant profile may monotonically decrease in the direction from the light absorbing layer 17 to the optical filtering film 13.

A host semiconductor, such as InGaAs, heavily doped at an n-type dopant concentration, ND, of larger than 8.0E17 cm$^{-3}$, has a forbidden band in optical transition larger than the inherent bandgap, E0, of InGaAs, and exhibits optical absorption characteristics depending upon its n-type dopant concentration ND. Such a phenomenon is called as the Moss-Burstein effect. The Moss-Burstein effect shows that the InGaAs heavily-doped as above can transmit light in a part of wavelengths of light which can be absorbed by undoped InGaAs or lightly-doped InGaAs of less than 8.0E17 cm$^{-3}$. The heavily-doped InGaAs exhibits the forbidden band in optical transition which depends upon the dopant concentration thereof. The optical filtering film includes semiconductor regions (21, 23, 25) having different dopant concentrations ND in the range of more than 8.0E17 cm$^{-3}$. These different dopant concentrations of the optical filtering film in the infrared detecting semiconductor device 10 allows the semiconductor regions (21, 23, and 25) to change amounts of light incident on the light absorbing layer 17 depending upon their light absorption characteristics, so that the optical filtering film 13 can provide the infrared detecting semiconductor device 10 with not optical response characteristics inherent to the light absorbing layer 17 but a combined optical absorption property produced from the light absorption characteristics of the light absorbing layer 17 and the optical filtering film 13. As seen from the above, InGaAs having n-type dopant concentrations of larger than 8.0E17 cm$^{-3}$ can adjust the photo response characteristics of the infrared detecting semiconductor device 10.

Referring to part (a) of FIG. 2, a description will be given of the Moss-Burstein effect in InGaAs doped with an n-type dopant. FIG. 2 shows a conduction band and a valence band of undoped In$_x$Ga$_{1-x}$As. The undoped bulk InGaAs has an energy difference between the conduction and valence bands equal to a photon energy of 0.728 eV, and a wavelength of about 1.7 micrometer (at the In composition X of 0.53 the material of which is lattice-matched to InP). Part (b) of FIG. 2 also shows a conduction band Ec, a valence band Ev, and Fermi level Ef of InGaAs at an n-type dopant concentration larger than 8.0E17 cm$^{-3}$, for example, an n-type dopant concentration ND of 3.0E18 cm$^{-3}$. This bulk InGaAs exhibits an energy difference between the valence band Ev and a Fermi level Ef which is shifted to the conduction band Ec of InGaAs, and this energy difference has a value larger than the bandgap (0.728 eV) of the inherent GaInAs by 0.048 eV. This shifting of the Fermi level from the bandgap into the conduction band Ec is caused by the addition of an n-type dopant of 3.0E18 cm$^{-3}$. Exciting electrons in the valence band Ev needs a transition energy E1 from the valence band Ev to the Fermi level Ef located in the conduction band Ec. Part (c) of FIG. 2 shows the conduction band Ec and the valence band Ev of InGaAs at an n-type dopant concentration ND greater than $8.0E17$ $cm^{-3}$, for example, $3.0E19$ $cm^{-3}$. This bulk InGaAs thus doped exhibits an energy difference between the valence band Ev and the Fermi level Ef shifted to the conduction band Ec of InGaAs, and this energy difference has a value larger than the bandgap (0.728 eV) of the inherent GaInAs by 0.281 eV. This shifting of the Fermi level from the bandgap into the conduction band Ec is caused by the addition of an n-type dopant of $3.0E19$ $cm^{-3}$. Exciting electrons in the valence band Ev needs a transition energy E2 from the valence band Ev to the Fermi level Ef located in the conduction band Ec.

As seen from the above description, InGaAs containing an n-type dopant concentration larger than $8.0E17$ $cm^{-3}$ causes an excitation energy for optical transition of electrons, which is larger than the inherent bandgap energy of the bulk InGaAs, to increase with the n-type dopant concentration.

As shown in FIG. 1, the first, second and third semiconductor regions 23, 25, and 27 of the optical filtering film 13 are sequentially arranged in the direction from the light absorbing layer 17 to the optical filtering film 13, and have a first cross-sectional area S1, a second cross-sectional area S2, and a third cross-sectional area S3, respectively. The first cross-sectional area S1 is larger than the second cross-sectional area S2, and the second cross-sectional area S2 is larger than the third cross-sectional area S3. Each of the first, second and third cross-sectional areas S1, S2, and S 3 is defined on a plane intersecting the first axis Ax1.

The third semiconductor region 27 provided with the smallest dopant concentration and the smallest third cross-sectional area S3 in the optical filtering film 13 allows the infrared detecting semiconductor device 10 to absorb light in long to short wavelengths in the light sensitive wavelength range of the infrared detecting semiconductor device 10. The second semiconductor region 25 provided with a middle dopant concentration and the second cross-sectional area S2 larger than the third cross sectional area S3 in the optical filtering film 13 allows the infrared detecting semiconductor device 10 to absorb light in middle to short wavelengths in the light sensitive range of the infrared detecting semiconductor device 10. The first semiconductor region 23 provided with the heaviest dopant concentration and the first cross-sectional area S1 larger than the second cross sectional area S2 in the optical filtering film 13 allows the infrared detecting semiconductor device 10 to absorb light in short wavelengths in the light sensitive range of the infrared detecting semiconductor device 10.

Exemplary ratio of cross sectional areas.
Semiconductor region (cross-sectional area): Relative value of cross-sectional areas.
First semiconductor region 23 (S1): cross sectional area S3 of 4.
Second lower semiconductor region 25a (S2D, S2): cross sectional area S2U of 8.
Second upper semiconductor region 25b (S2U, S2): cross sectional area S2D of 12.
Third semiconductor region 27 (S3): cross sectional area S3 of 16.

The light absorbing layer 17 includes multiple first semiconductor layer 17a and multiple second semiconductor layers 17b, and the first and second semiconductor layers 17a and 17b are alternately arranged in the direction of the first axis Ax1. The first semiconductor layers 17a are made of material, such as undoped InGaAs, and the second semiconductor layers 17b are made of material, such as GaAsSb.

The multiple InGaAs regions (23, 25a, 25b, and 27) having different n-type dopant concentrations can compensate for the optical response characteristics of the type-II light absorbing layer 17 in wavelength dependence, which is sensitive to an infrared wavelength region, to enable the infrared detecting semiconductor device 10 to have desired optical response characteristics.

Figure 3:
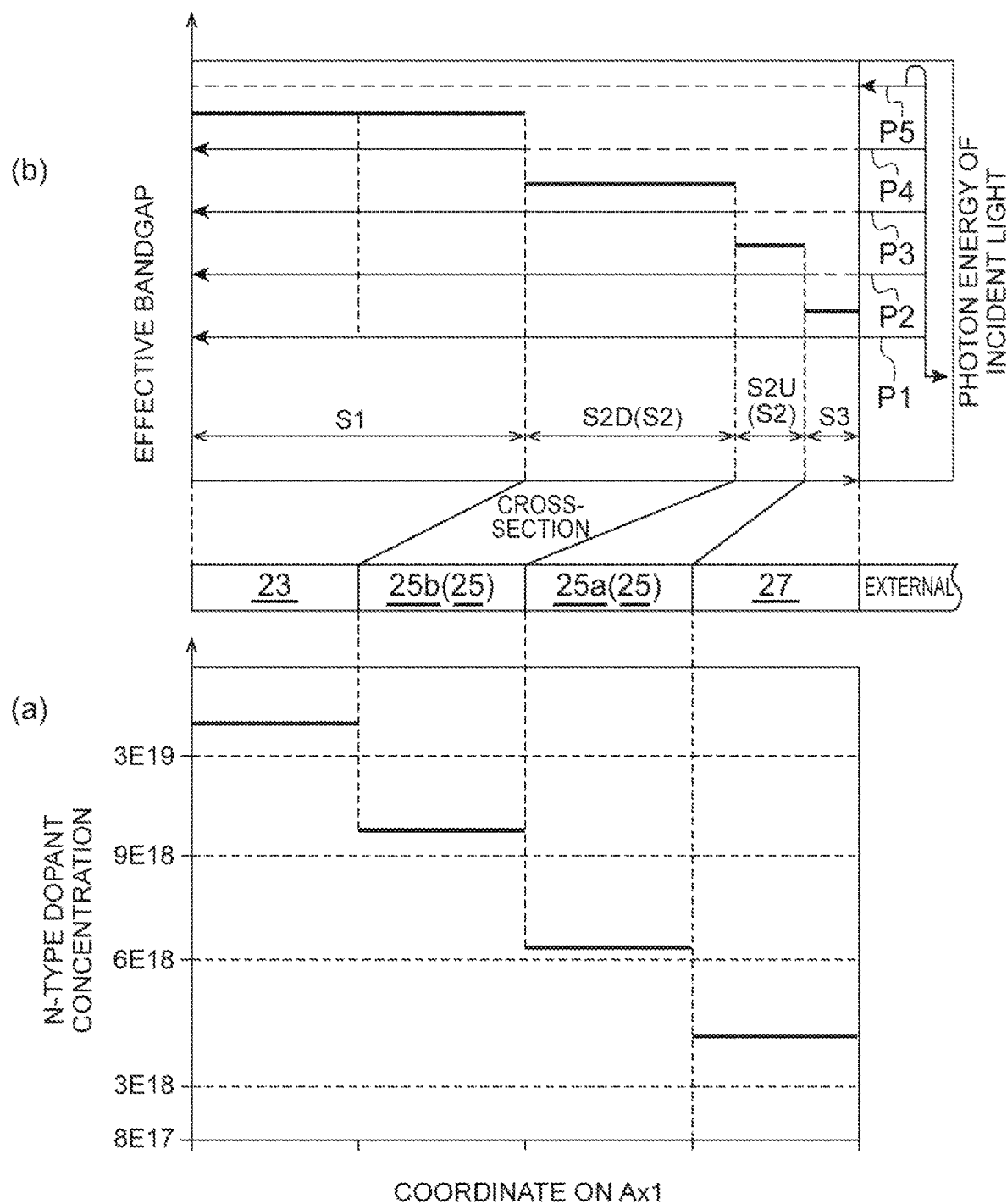
FIG. 3 is a schematic view showing an illustrative optical filtering film in the infrared detecting semiconductor device according to the present embodiment.

FIG. 3 is a view illustrating an optical filtering film in the infrared detecting semiconductor device according to the present embodiment. The optical filtering film 13 shown in part (a) of FIG. 3 includes four semiconductor regions (23, 25a, 25b, and 27).

Semiconductor region (cross-sectional area): n-type dopant concentration ($cm^{-3}$).
First semiconductor region 23 (S1): 3E19.
Second lower semiconductor region 25a (S2D, S2): 9E18.
Second upper semiconductor region 25b (S2U, S2): 6E18.
Third semiconductor region 27 (S3): 3E18.

These semiconductor regions (23, 25b, 25a, and 27) are arranged so that the n-type dopant concentration profile monotonically changes in the direction from the light absorbing layer 17 to the optical filtering film 13 (outward). The first semiconductor region 23 of the highest concentration is disposed on the light absorbing layer 17; the second lower semiconductor region 25b having an upper middle concentration is disposed on the first semiconductor region 23; the second higher semiconductor region 25a having a lower middle concentration is disposed on the second lower semiconductor region 25a; and the third semiconductor region 27 having the lowest concentration is disposed on the second upper semiconductor region 25b.

Referring to part (b) of FIG. 3, these semiconductor regions (23, 25b, 25a, and 27) have respective forbidden bands in optical transition. The first semiconductor region 23 of the largest optical forbidden band is disposed on the light absorbing layer 17; the second lower semiconductor region 25b of the next largest forbidden band is disposed on the first semiconductor region 23; the second upper semiconductor region 25a of the next-next largest forbidden band is disposed on the second lower semiconductor; and the third semiconductor region 27 of the smallest forbidden band is disposed on the second upper semiconductor region 25a. The drawing shows five arrows, which indicate five representative optical components having wavelengths (P1, P2, P3, P4, and P5) arranged in descending sequence in wavelength as follows: the first optical component P1 (the light of the longest wavelength); the second optical component P2; the third optical component P3; the fourth optical component P4; and the fifth optical component P5 (the light of the shortest wavelength). The first optical component P1 passes through the semiconductor regions (23, 25b, 25a, and 27). The second optical component P2 passes through the semiconductor regions (23, 25b, and 25a), but is absorbed by the semiconductor region (27). The third optical component P3 passes through the semiconductor regions (23 and 25b), but is absorbed by the semiconductor regions (25a and 27). The fourth optical component P4 passes through the semiconductor region (23), but is absorbed by the semiconductor regions (25b, 25a, and 27). The fifth optical component P5 is absorbed by the semiconductor regions (23, 25b, 25a, and 27). In the optical filtering film 13, the semiconductor regions (23, 25b, 25a, and 27) having different dopant concentrations are arranged in ascending order of n-type dopant concentration in the direction from the light absorbing layer 17 to the optical filtering film 13, and the semiconductor regions (23, 25b, 25a, and 27) having respective cross-sectional areas (each cross sectional area being defined in the plane intersecting the first axis Ax1) are arranged in descending order of cross-sectional area in the above direction, so that the cross-sectional areas increases with the n-type dopant concentrations. This arrangement allows the semiconductor region (27) having the lowest n-type dopant concentration to be in the uppermost position and allows the semiconductor region (23) having the highest n-type dopant concentration to be in the lowermost position.

The first light P1 passes through the first semiconductor region 23, the second lower semiconductor region 25b, the second upper semiconductor region 25a, and the third semiconductor region 27. The second light P2 first enters the outer area of the second upper semiconductor region 25a outside the third semiconductor region 27. The third light P3 first enters the outer part of the second lower semiconductor region 25b outside the third semiconductor region 27 and the second upper semiconductor region 25a. The fourth light P4 first enters the first semiconductor region 23 outside the third semiconductor region 27, the second upper semiconductor region 25a, and the second lower semiconductor region 25b. The fifth light P5 cannot pass through the first semiconductor region 23, the second lower semiconductor region 25b, the second upper semiconductor region 25a, and the third semiconductor region 27.

The ratios of the cross-sectional areas of the semiconductor regions (23, 25b, 25a, and 27) determine the amounts of transmitted optical components (P1 to P5, and reference symbol "L1" in FIG. 1) incident on the illuminated face of the infrared detecting semiconductor device 10.

EXAMPLE 1

Figure 4:
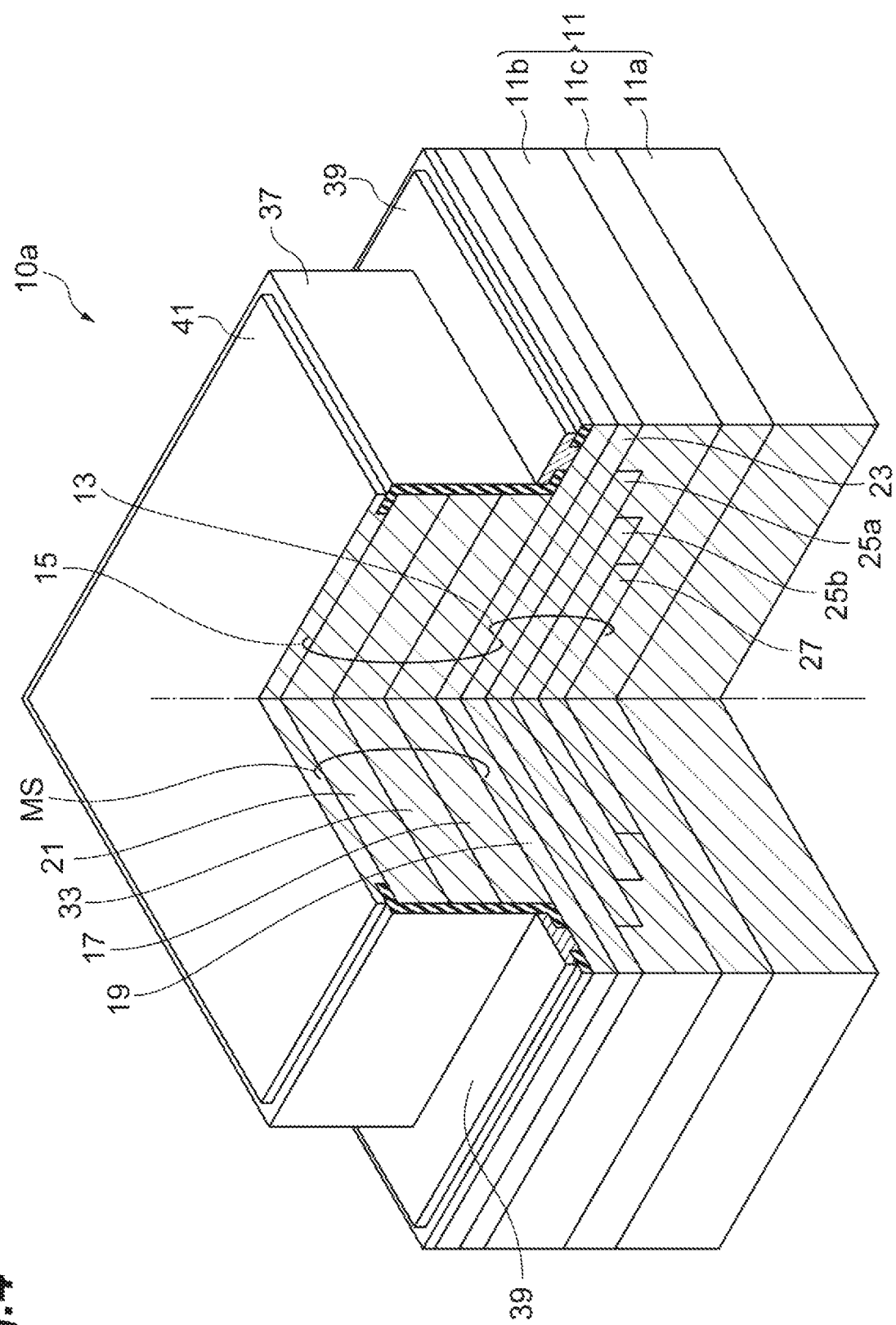
FIG. 4 is a partially-cutaway schematic view showing an infrared detecting semiconductor device according to the embodiment.

FIG. 4 is a partially cutaway schematic view showing an infrared detecting semiconductor device according to the embodiment. The infrared detecting semiconductor device 10a includes a supporting body 11, an optical filtering film 13 disposed on the supporting body 11, and a photodiode structure 15 disposed on the optical filtering film 13, and further includes a passivation film 37 covering the optical filtering film 13 and the photodiode structure 15, a first electrode 39 and a second electrode 41 both disposed on the photodiode structure 15. The photodiode structure 15 has a mesa MS. The mesa MS includes a light absorbing layer 17. Specifically, the first electrode 39 is in contact with the first conductivity-type semiconductor layer 19, and the second electrode 41 is in contact with the second conductivity-type semiconductor layer 21. The mesa MS mounts the first electrode 39 on the upper face thereof, and the lower face of the photodiode structure 15, and more specifically, the first conductivity-type semiconductor layer 19 is in contact with the optical filtering film 13. The mesa MS can be formed by photolithography and etching. The passivation film 37 includes a silicon-based inorganic insulating film, such as silicon oxide, grown by chemical vapor deposition, and the silicon-based inorganic insulating film is patterned by photolithography and etching. The first and second electrodes 39 and 41 can be made of, for example, AuTi/AuZnAu (P-electrode) and Au—Ge—Ni (N-electrode), respectively.

Illustrative structure of semiconductor layers in the infrared sensing semiconductor device 10.
Optical filtering film 13: InGaAs having an n-type dopant concentration of larger than $8.0E17$ $cm^{-3}$.

First semiconductor region 23: Si-doped InGaAs having an n-type dopant concentration of $2.0E19$ $cm^{-3}$ or more, and ba thickness in a range of 1000 to 2000 nm.
Second semiconductor region 25: Si-doped InGaAs having an n-type dopant concentration of $3.0E18$ $cm^{-3}$ or more, and $2.0E19$ $cm^{-3}$ or less, a thickness in a range of 1000 to 4000 nm.
Third semiconductor region 27: Si-doped InGaAs having an n-type dopant concentration of $3.0E18$ cm $-3$ or less, and a thickness in a range of 1000 to 2000 nm.
Photodiode structure 15: III-V compound semiconductor region having an n-type dopant concentration of $8.0E17$ $cm^{-3}$ or less.
First conductivity-type semiconductor layer 19 (p-type contact layer): Zn-doped InP, a thickness of 800 nm.
Semiconductor layer 33: undoped InGaAs having a thickness of 800 nm.
Light absorbing layer 17: InGaAs/GaAsSb quantum well structure having a thickness in a range of 500 to 4000 nm, and a stacking number in a range of 50 to 400.
Second conductivity type semiconductor layer 21 (n-type contact layer): Si-doped InGaAs contact layer (ND is equal to $1E18$ $cm^{-3}$) having a thickness of 100 nm.
The semiconductor layer 33 can generate photo carriers.
The p-type contact layer 29 is in contact with the optical filtering film 13 to form a pn-junction.
These semiconductor layers are grown on the principal surface 35a of the substrate 35 by molecular beam epitaxy or organometallic vapor phase epitaxy.
Supporting body 11: silicon substrate, epoxy resin, and silicon oxide film.

The supporting body 11 includes, for example, a silicon substrate serving as a base 11a, an epoxy resin serving as a filling 11b, and an inorganic film serving as a bonding layer 11c. The inorganic film may include a silicon oxide film. The bonding layer 11c fixes the optical filtering film 13 of III-V compound semiconductor to the supporting body 11. The bonding layer 11c is made of a material that has an affinity for both the material of the base 11a and the III-V compound semiconductor to be bonded, and is formed on the base 11a. The III-V compound semiconductor of the optical filtering film 13 is subjected to heat treatment, pressing treatment, or both of these treatments for bonding with the bonding layer 11c of the support body 11. The filling 11b fills a gap between the optical filtering film 13 and the principal surface of the supporting base 11. The filling 11b can be formed as follows: fluid resin is supplied to the gap, and the gap is filled with the resin, and then the resin is cured. The filling 11b includes, for example, an epoxy resin containing filler, and the filler has a particle diameter of 10 to 50 nanometers (the filler contains, for example, fused silica of particle size in a range of 10 to 50 nm) to allow infrared rays to pass through the filling 11b.

Specifically, the second conductivity-type semiconductor layer 21 includes a p-type contact layer 29, such as p-type InP, having a bandgap larger than bandgaps of the optical filtering film 13 and the light absorbing layer 17. The optical filtering film 13 of n-type InGaAs having an n-type dopant concentration of larger than $8.0E17$ $cm^{-3}$ is disposed on the p-type InP contact layer. The infrared detecting semiconductor device 10a allows the light absorbing layer 17 to generate optical carriers in response to light incidence. The optical carriers from the light absorbing layer 17 do not pass through the optical filtering film 13. The optical filtering film 13 has an n-type dopant profile enabling desired light absorption characteristics, which is independent of the electrical characteristics of the photodiode structure 15.

Figure 5:
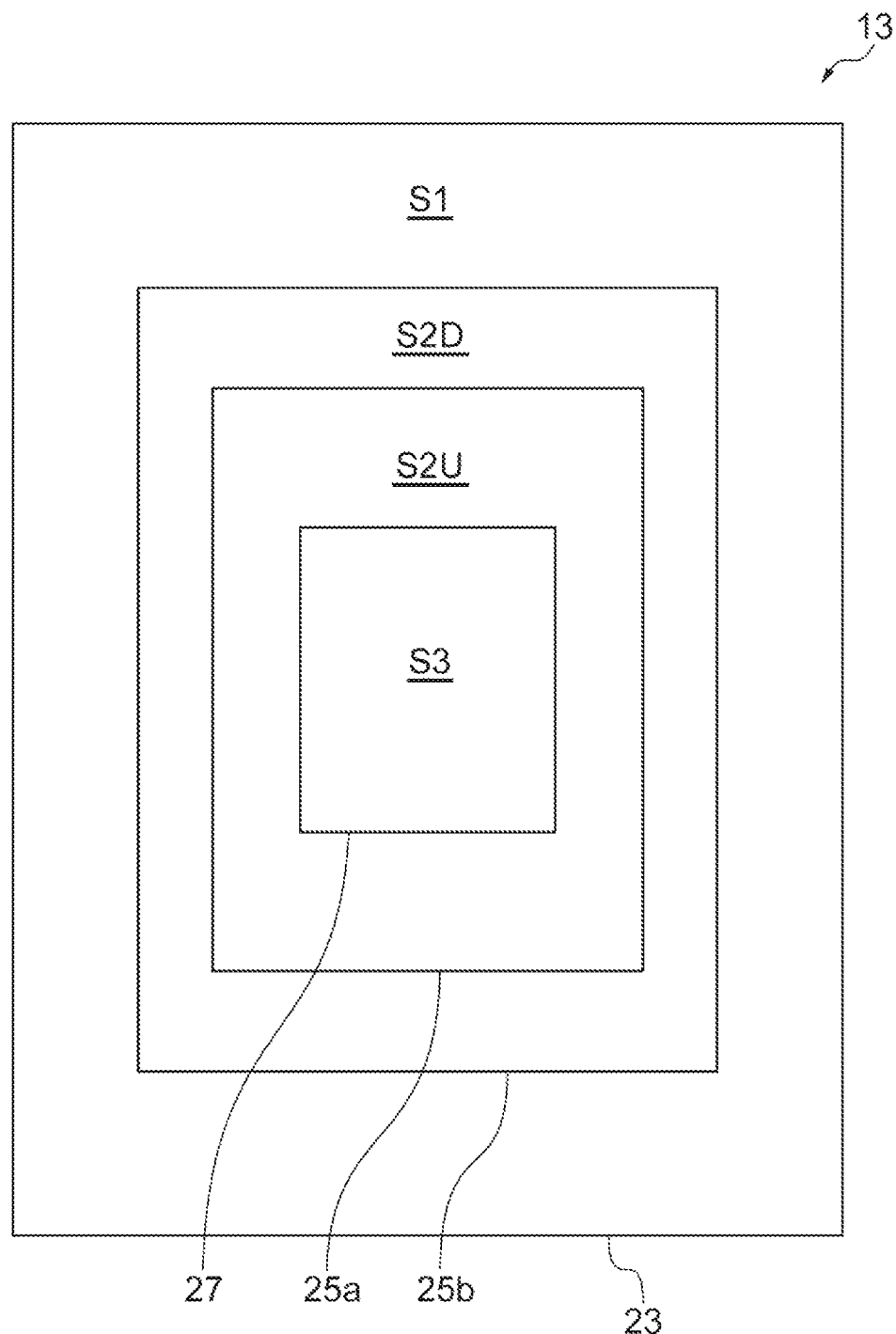
FIG. 5 is a plan view showing one optical filtering film of the infrared detecting semiconductor device according to example 1.

FIG. 5 is a top view showing a shape of the optical filtering film of the infrared detecting semiconductor device according to the first embodiment. The cross-sectional areas of the semiconductor regions (23, 25b, 25a, and 27) each are rectangular or square.

Semiconductor region (cross-sectional area) having a square, length of one side of the square (in meter),
First semiconductor region 23 (S1): 18E-6.
Second lower semiconductor region 25b (S2D, S2): 13.5E-6.
Second upper semiconductor region 25a (S2U, S2): 9.0E-6.
Third semiconductor region 27 (S3): 4.5E-6.

Figure 6:
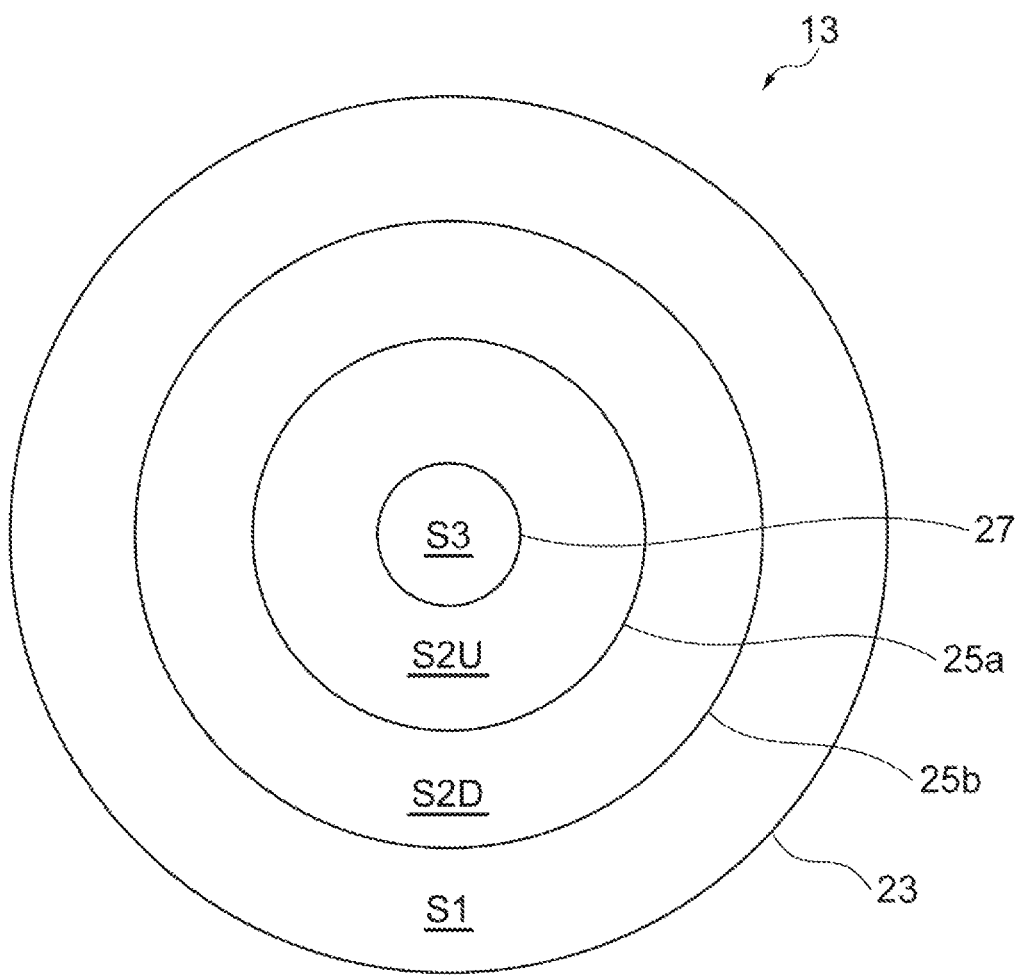
FIG. 6 is a plan view showing another optical filtering film of the infrared detecting semiconductor device according to Example 1.

FIG. 6 is a top view showing a shape of another optical filtering film of the infrared detecting semiconductor device according to the first embodiment. The cross-sectional areas of the semiconductor regions (23, 25b, 25a, and 27) each are circular or elliptical.

Semiconductor region (cross sectional area) each having a circle, radius of circle (in meter)
First semiconductor region 23 (S1): 9E-6.
Second lower semiconductor region 25b (S2D, S2): 6.75 E-6.
Second upper semiconductor region 25a (S2U, S2): 94.5E-6.
Third semiconductor region 27 (S3): 2.25E-6.

As understood from the description with reference to FIGS. 1 to 6, the shape of the cross-section is not limited to specific shapes, such as a rectangle and a circle, and may be a square, an ellipse, a triangle, and an n-polygon ("n" is a natural number of five or larger).

The semiconductor regions (23, 25b, 25a, and 27) having respective cross-sectional areas are combined to form ratios of any of two adjoining regions among the semiconductor regions (23, 25b, 25a, and 27), such that the infrared detecting semiconductor device according to the first embodiment is provided with a desired optical response characteristics. The cross sectional areas of these semiconductor regions can be determined by consideration of variation in forbidden band due to the Moss-Burstein effect

EXAMPLE 2

Figure 7:
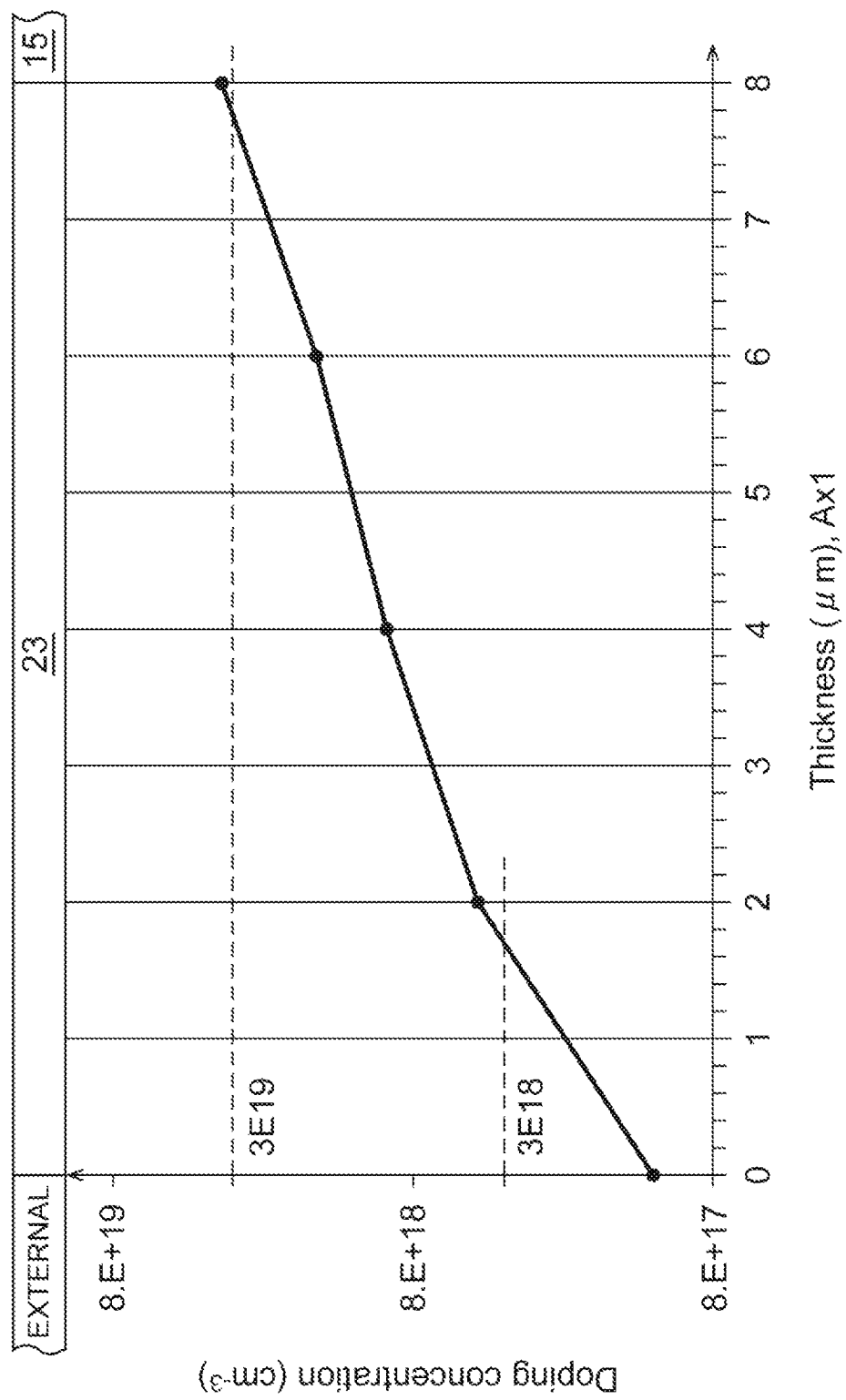
FIG. 7 is a view showing an n-type dopant concentration profile of still another optical filtering film of the infrared detecting semiconductor device according to Example 2.

FIG. 7 is a drawing showing an n-type dopant concentration in an optical filtering film of another infrared detecting semiconductor device according to Example 2. The n-type dopant concentration of the optical filtering film 13 is not limited to a step-like profile, but may have a graded profile, which monotonically varies in the direction of the first axis Ax1. Alternatively, the n-type dopant concentration of the optical filtering film 13 may have a combination of step-like and graded profiles.

EXAMPLE 3

Figure 8:
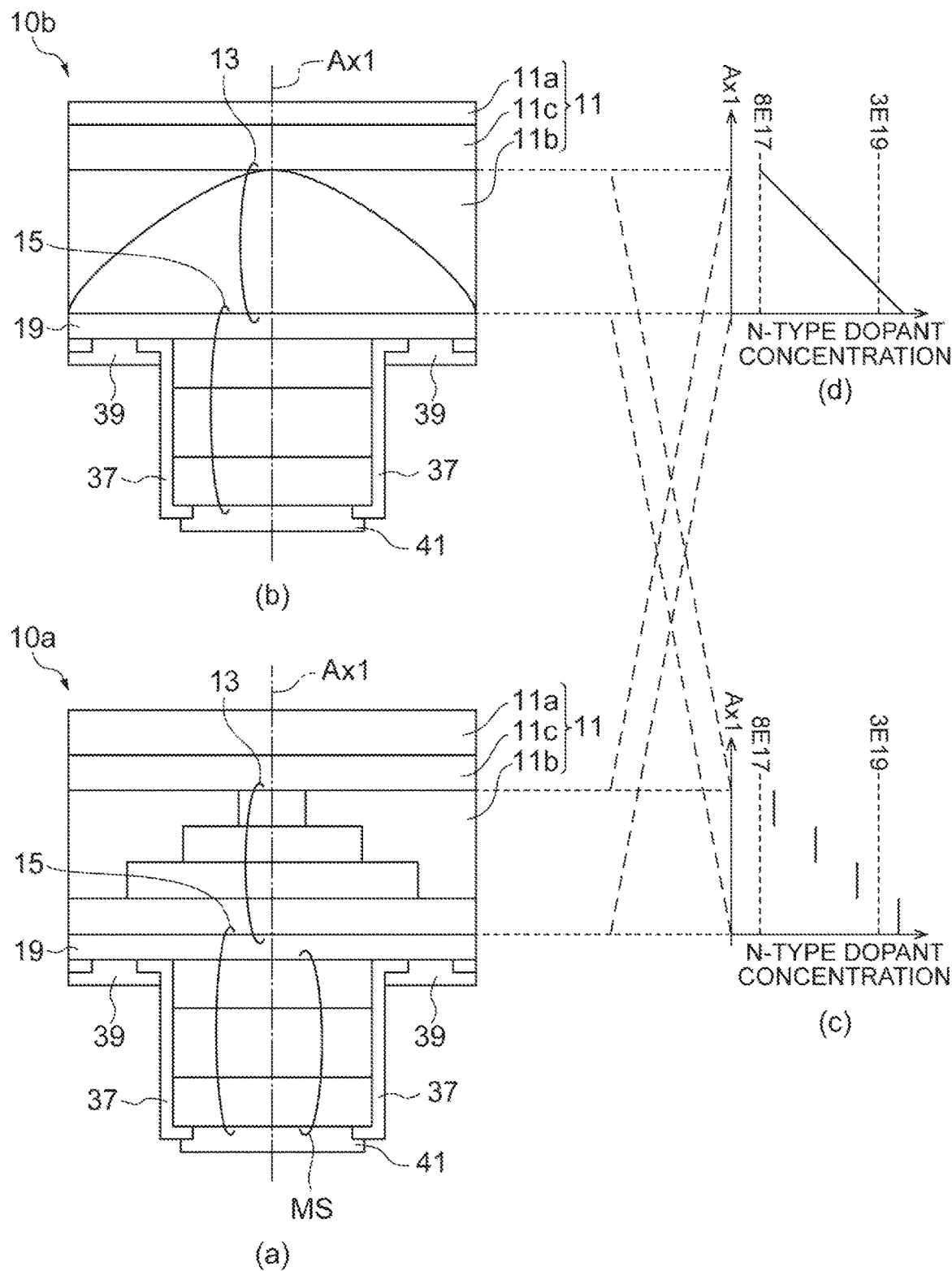
FIG. 8 is a plan view showing the shapes of optical filtering films for the infrared detecting semiconductor device according to Example 3, and the n-type dopant concentration profiles of the optical filtering films.

FIG. 8 is a view showing the shapes of the optical filtering films for the infrared detecting semiconductor device according to Example 3, and the n-type dopant concentration profiles thereof.

Referring to part (a) of FIG. 8, the infrared detecting semiconductor device 10a is shown. The optical filtering film 13 of the infrared detecting semiconductor device 10a has a stepwise appearance. This step-like shape of the optical filtering film 13 can be formed by repeating photolithography and etching processes. The infrared detecting semiconductor device 10a may provide the optical filtering film 13 with a step-like profile of n-type dopant concentration shown in part (c) of FIG. 8 or a graded profile shown in part (d) of FIG. 8.

Referring to part (b) of FIG. 8, the infrared detecting semiconductor device 10b is shown. The optical filtering film 13 of the infrared detecting semiconductor device 10b has an appearance of a convex shape. This curved shape of the optical filtering film 13 is formed as follows: a patterned thick resist is formed to define the outer edge of the optical filtering film 13 on a doped semiconductor film for the optical filtering film 13; the thick resist is deformed by heat treatment; and the deformed resist and the semiconductor are processed by etching to transfer the shape of the thick resist to the doped semiconductor film. The optical filtering film 13 of the infrared detecting semiconductor device 10b may have a graded profile of n-type dopant concentration shown in part (d) of FIG. 8, or a stepwise profile of n-type dopant concentration shown in part (c) of FIG. 8.

EXAMPLE 4

Figure 9A:
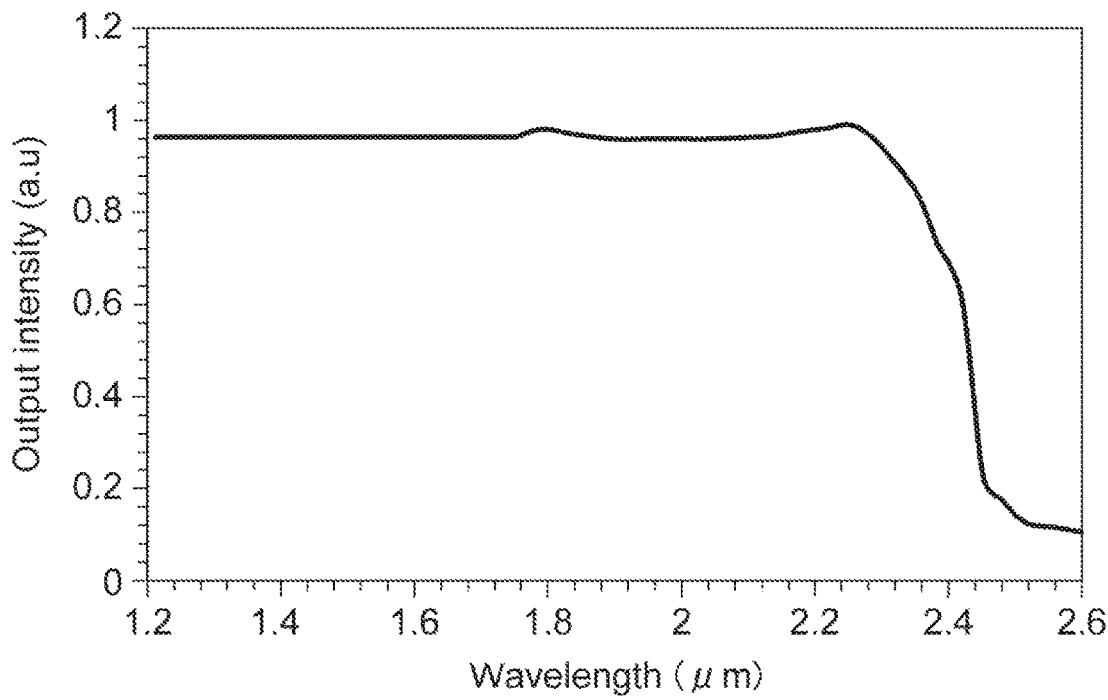
FIG. 9A is a graph showing a compensated optical response of the infrared detecting semiconductor device by use of the optical filtering film according to the embodiment.
Figure 9B:
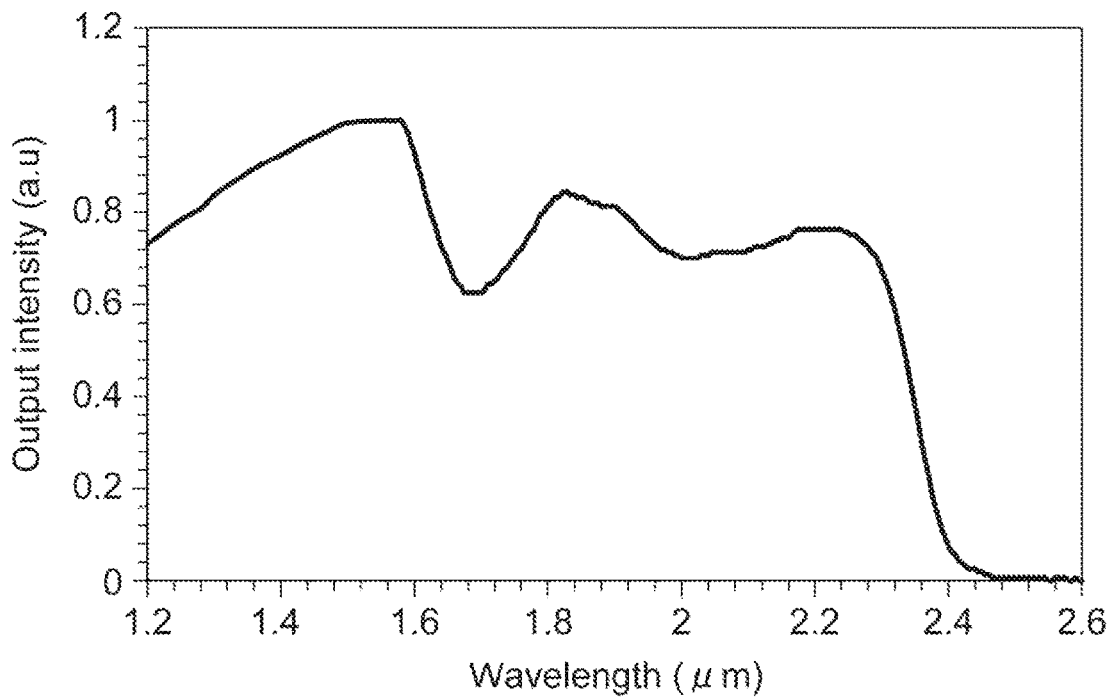
FIG. 9B is a graph showing an intrinsic optical response of an infrared detecting semiconductor device of no optical filtering film.
Figure 10:
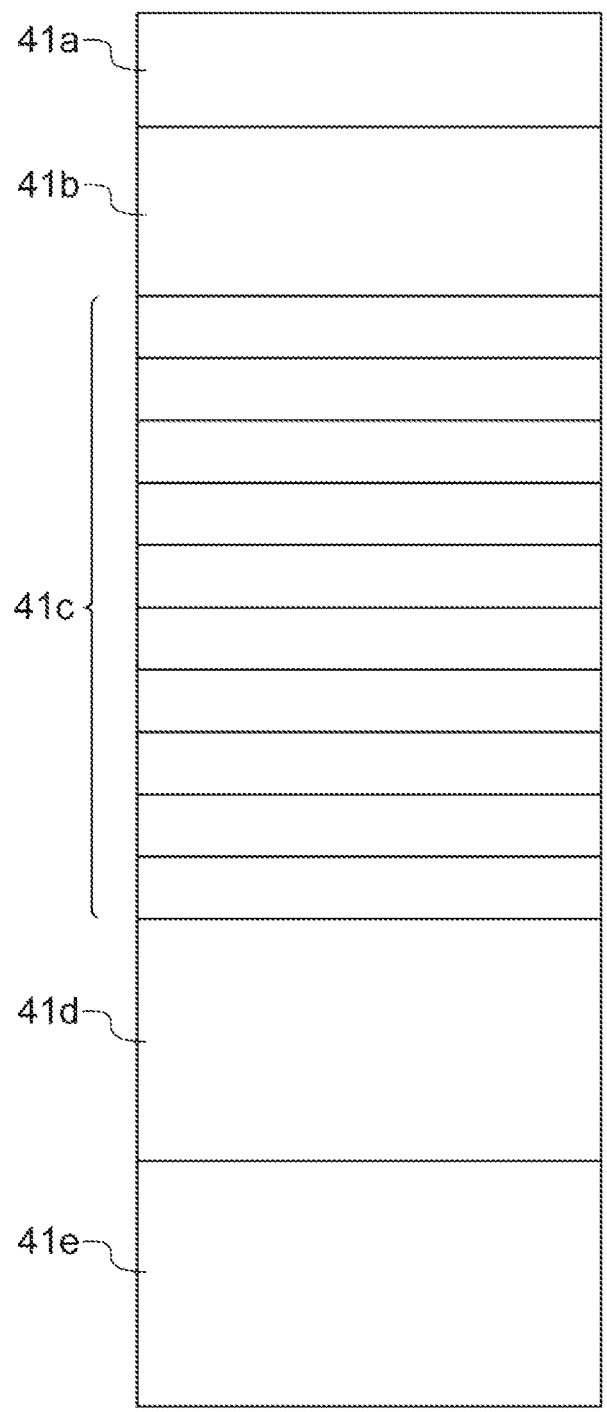
FIG. 10 is a schematic view showing a semiconductor laminate structure of an infrared detecting semiconductor device which does not have any optical filtering film.

FIGS. 9A and 9B are views showing optical response characteristics with presence and absence of compensation with the optical filtering film according to the embodiment. FIG. 10 is a schematic view showing a semiconductor laminate of an infrared detecting semiconductor device excluding the optical filtering film. Specifically, FIG. 9A shows an optical response characteristics compensated by the optical filtering film according to the present embodiment, and FIG. 9B shows an optical response characteristics of the photodiode structure 4 shown in FIG. 10 (without the compensation by the optical filtering film).

III-V compound semiconductor region of the photodiode structure 4 shown in FIG. 10.
P-type contact layer 41a: Zn-doped InP having a thickness of 500 nm.
Semiconductor layer 41b: undoped InGaAs having a thickness of 500 nm.
Light absorbing layer 41c: Type-II InGaAs/GaAsSb quantum well structure having a thickness of 1000 nm and a stacking number of 200.
N-type contact layer 41d: Si-doped InGaAs (ND=1E17 $cm^{-3}$) having a thickness of 500 nm.
N-type semiconductor layer 41e: Si-doped InP (ND=1E18 $cm^{-3}$).

The structure of the optical filtering film enabling the optical response characteristics shown in FIG. 9A.
Semiconductor region (cross-sectional area), thickness, n-type dopant concentration.
First semiconductor region 23 (S1): 2000 nm, 3E19 $cm^{-3}$.
Second lower semiconductor region 25a (S2D): 2000 nm, 9E18 $cm^{-3}$.
Second upper semiconductor region 25b (S2U): 2000 nm, 6E18 $cm^{-3}$.
Third semiconductor region 27 (S3): 2000 nm, 3E18 $cm^{-3}$.
For example, the dopant concentration of 9.4E17 $cm^{-3}$ allows the absorption of light having a wavelength of 1.6 micrometers.
Ratio of cross sectional areas: S1/S2D/S2U/S3=4/3/2/1.

As shown in FIG. 9A, variation in optical response characteristics ranges from −10% to +10% in the wavelength range of 1.2 to 2.35 micrometers, and the infrared detecting semiconductor device according to the present embodiment exhibits flat optical response characteristics.

Figure 11:
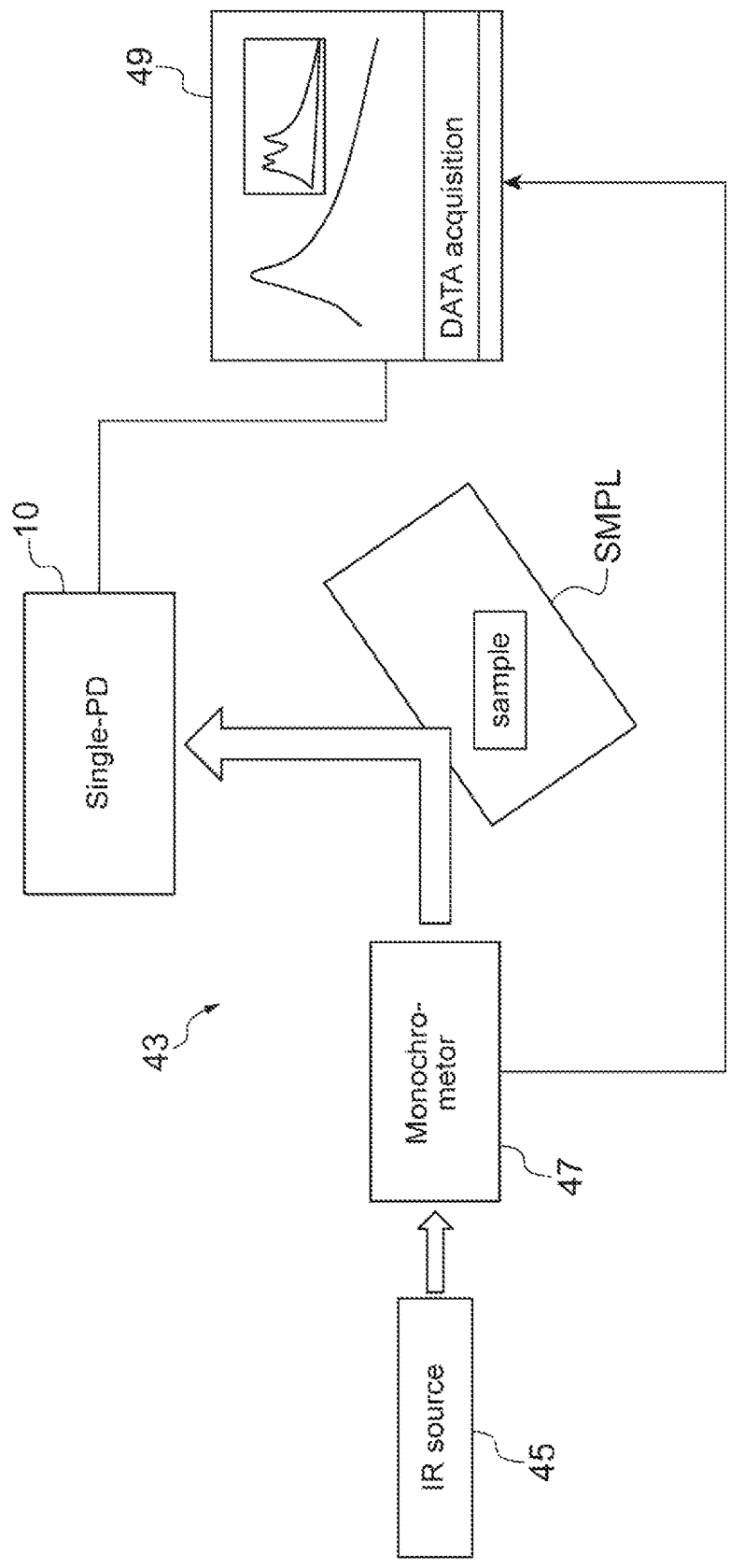
FIG. 11 is a schematic view showing a measurement system including an infrared detecting semiconductor device according to the embodiment.

FIG. 11 is a schematic view showing a measuring system including an infrared detecting semiconductor device according to the present embodiment. The measuring system 43 produces monochromatic light from light given by an infrared light source 45 (wavelengths of 1.2 to 2.35 micrometers) with a monochromator 47, and illuminates, with the monochromatic light, an article SMPL to be measured. The article SMPL reflects light toward the infrared detecting semiconductor device 10. The monochromator 47 scans the wavelength of light from the infrared light source 45 to deliver the scanned light to the article SMPL, and in synchronization with the scanning, the infrared detecting semiconductor device 10 (10a and 10b) receives the light reflected by the article SMPL. The infrared detecting semiconductor device 10 (10a and 10b) sends measurement results to a processing device 49. The measuring system 43 produces the infrared reflection spectrum of the article SMPL less dependent upon variation in optical response of the optical absorbing layer of the infrared detecting semiconductor device 10 (10a and 10b). The reduced variation in optical response characteristics of the infrared detecting semiconductor device 10 (10a and 10b) allows the infrared reflection spectrum of the article SMPL to be less influenced by the detecting device.

With reference to FIGS. 12A, 12B, 13A, 13B, 14A, 14B, 15A, 15B, 16A, 16B, 17A and 17B, a description is given of a method for fabricating an infrared sensing semiconductor device.

Figure 12A:
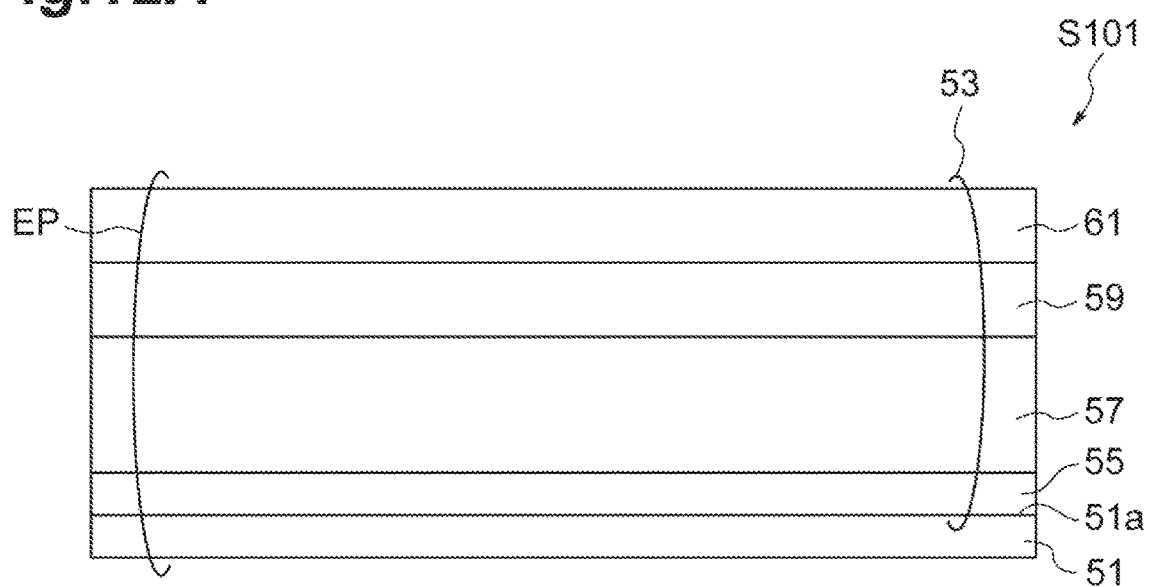
FIG. 12A is a schematic view showing a major step in the method of according to the embodiment, specifically a process for forming an epitaxial substrate.

In step S101, as shown in FIG. 12A, an epitaxial substrate EP is prepared for the fabrication of the infrared sensing semiconductor device. The epitaxial substrate EP includes an InP substrate 51 and a photodiode structure 53 grown on the principal surface 51a of the InP substrate 51. The photodiode structure 53 includes an n-type InGaAs layer 55 for a contact layer of the first conductivity-type, a light absorbing layer 57 of a type-II InGaAs/GaAsSb quantum well structure, an InGaAs layer 59, and a p-type InP for a contact layer 61 of the second conductivity-type. The n-type InGaAs layer 55, the light absorbing layer 57 of the type-II InGaAs/GaAsSb quantum well structure, the InGaAs layer 59, and the contact InP layer 61 are grown by, for example, molecular beam epitaxy or organometallic vapor phase epitaxy.

Figure 12B:
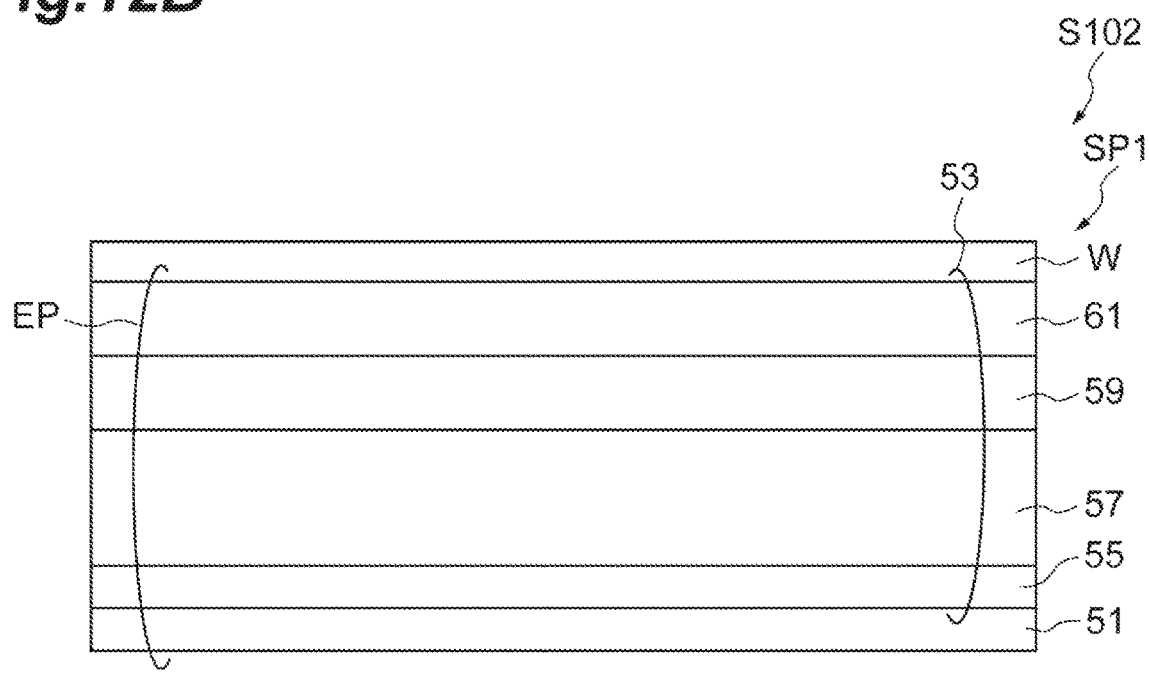
FIG. 12B is a schematic view showing a major step in the method of according to the embodiment, specifically a process for bonding a carrier wafer to the epitaxial substrate including a semiconductor wafer.

In step S102, as shown in FIG. 12B, a carrying wafer W is bonded to the principal surface (of the p-type InP layer 61) of the epitaxial substrate EP to form a first substrate product SP1. The wafer W includes, for example, a Si substrate or an InP substrate (Si or InP), and the bonding is carried out by a bonding method, such as bonding with epoxy resin, photoresist, and wax.

Figure 13A:
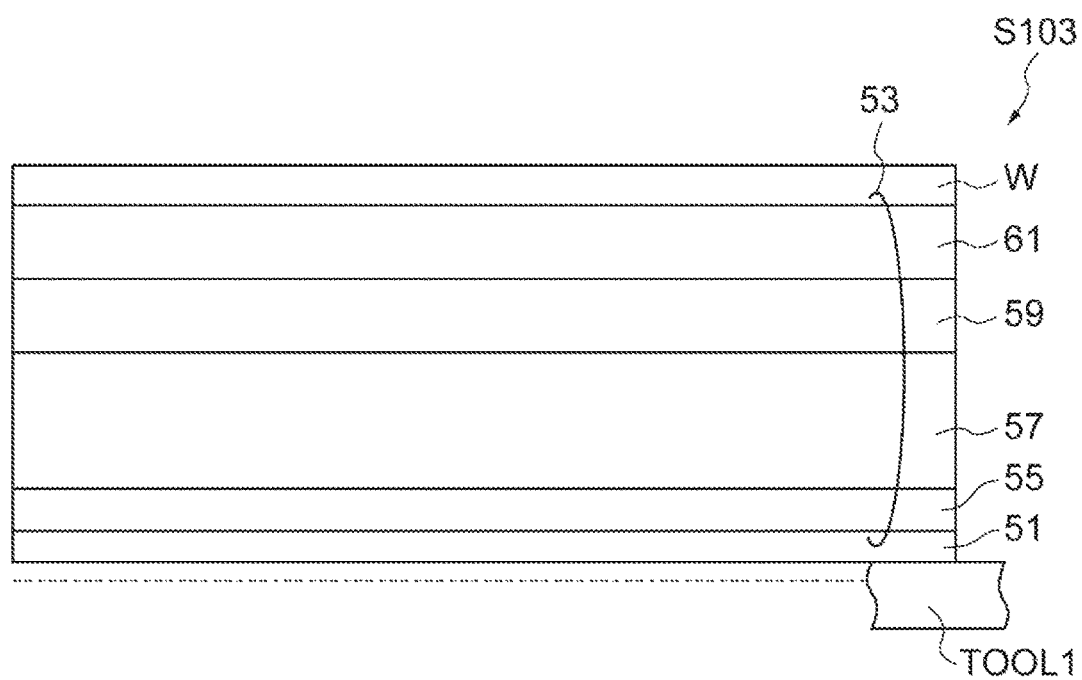
FIG. 13A is a schematic view showing a major step in the method of according to the embodiment, specifically a process for removing the semiconductor wafer.

In step S103, as shown in FIG. 13A, the InP substrate 51 is removed from the epitaxial substrate EP that has already been bonded to the carrying wafer W. This removal is carried out by at least one of mechanical processing, such as polishing using the apparatus TOOL1, or chemical processing, such as wet etching.

Figure 13B:
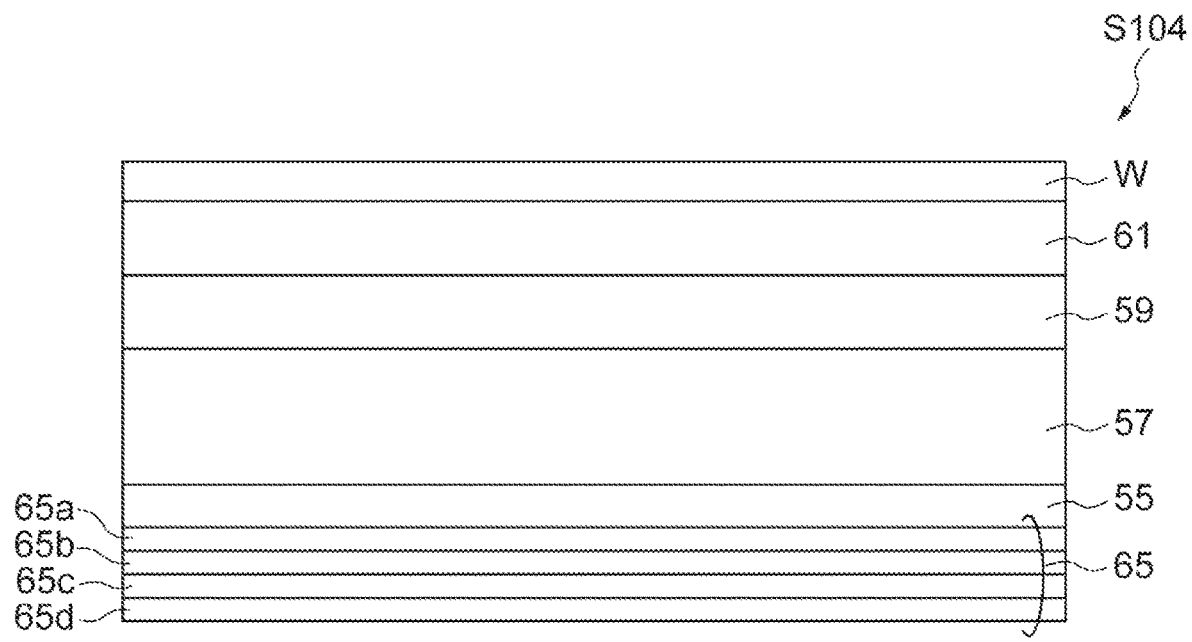
FIG. 13B is a schematic view showing a major step in the method of according to the embodiment, specifically a process for growing a semiconductor laminate doped with n-type dopant for the optical filtering film.

In step S104, as shown in FIG. 13B, removal of the InP substrate 51 causes the n-type InGaAs layer 55 to appears, and an InGaAs region 65 for the optical filtering film 13, which has an n-type dopant concentration larger than 8.0E17 $cm^{-3}$, is grown on the n-type InGaAs layer 55. The InGaAs region 65 can be grown by, for example, a molecular beam epitaxy or a metal-organic vapor phase epitaxy. This growth varies the supplied amount of the dopant gas to provide the InGaAs region 65 with an n-type dopant profile monotonically changing in the film-thickness direction, for example, in a step-like or graded profile manner. In the embodiment, the InGaAs region 65 includes a first InGaAs layer 65a, a second InGaAs layer 65b, a third InGaAs layer 65c, and a fourth InGaAs layer 65d. The first InGaAs layer 65a, the second InGaAs layer 65b, the third InGaAs layer 65c, and the fourth InGaAs layer 65d have respective the n-type dopant concentrations sequentially reduced.

Figure 14A:
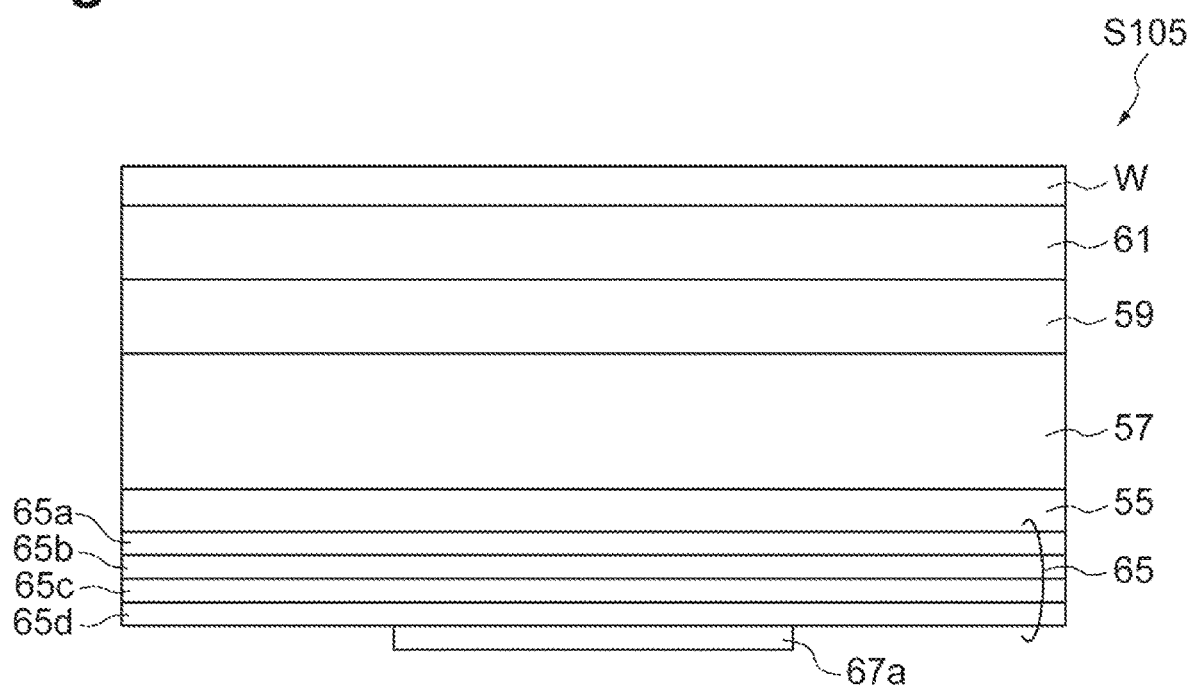
FIG. 14A is a schematic view showing a major step in the method of according to the embodiment, specifically a process for patterning the doped semiconductor laminate to form a top region.
Figure 14B:
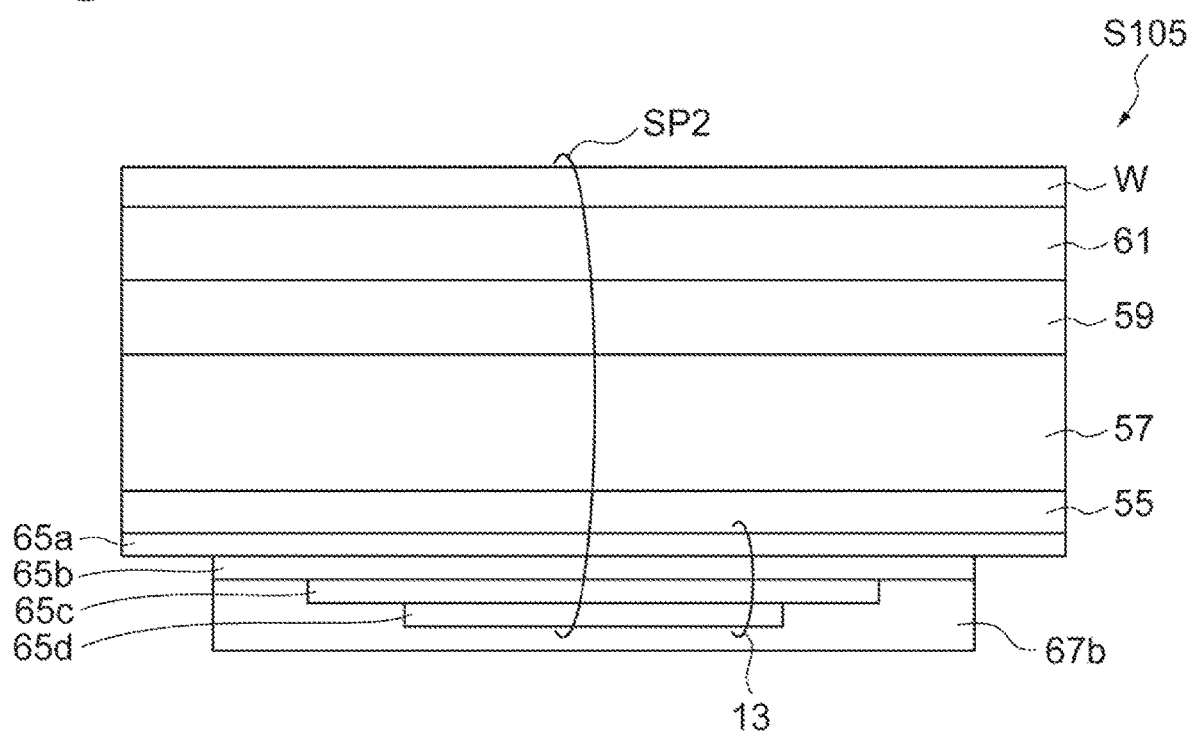
FIG. 14B is a schematic view showing a major step in the method of according to the embodiment, specifically a process for patterning the doped semiconductor laminate to form an intermediate region.

In step S105, as shown in FIG. 14A, the InGaAs region 65 is processed by etching to form the optical filtering film 13. This processing can be conducted by photolithography and etching. In the embodiment, the second InGaAs layer 65b, the third InGaAs layer 65c and the fourth InGaAs layer 65d in the InGaAs region 65 are sequentially patterned. For example, a resist mask 67a is formed on the fourth InGaAs layer 65d, and the fourth InGaAs layer 65d is etched with the resist mask 67a to expose a part of the third InGaAs layer 65c. The third InGaAs layer 65c is also processed by photolithography and etching. As shown in FIG. 14B, a resist mask 67b is formed on the second InGaAs layer 65b, and the second InGaAs layer 65b is etched with the resist mask 67b to expose a part of the first InGaAs layer 65a. In this manner, the InGaAs region 65 is processed to form the optical filtering film 13. In the optical filtering film 13, a part of the third InGaAs layer 65c is exposed without being covered with the fourth InGaAs layer 65d, a part of the second InGaAs layer 65b is exposed without being covered with the third InGaAs layer 65c, and a part of the first InGaAs layer 65a is exposed without being covered with the second InGaAs layer 65b. These processes produce a second substrate product SP2.

Figure 15A:
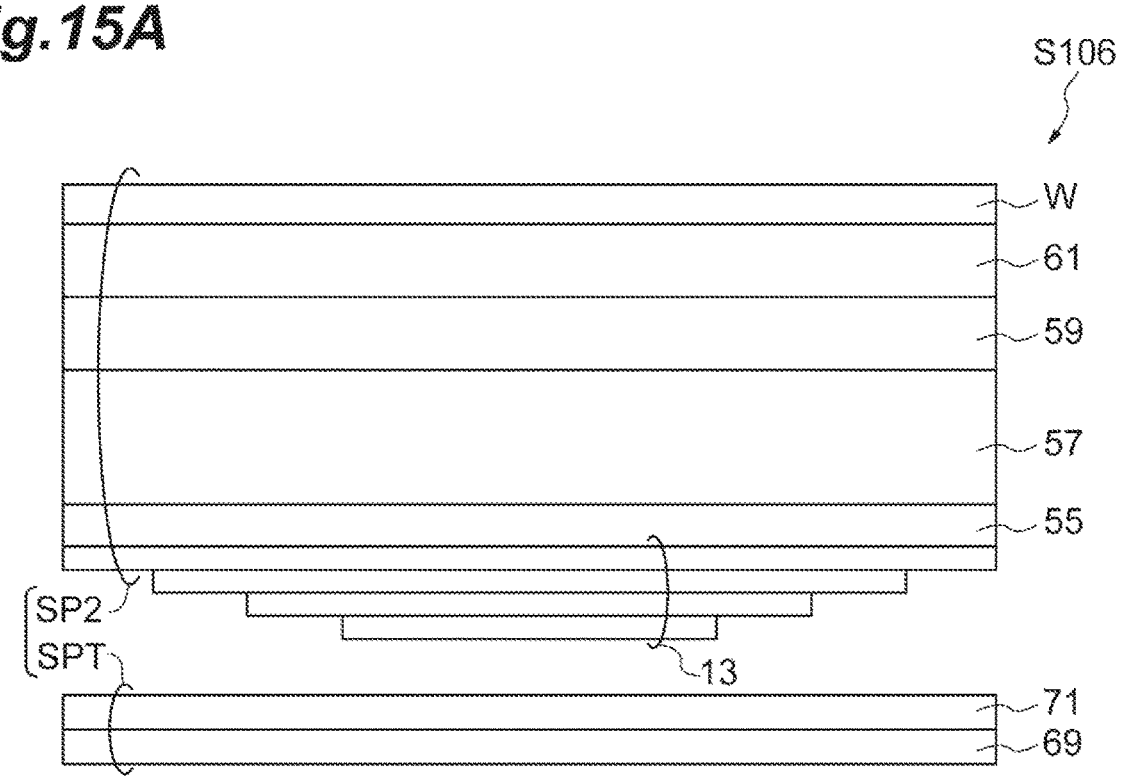
FIG. 15A is a schematic view showing a major step in the method of according to the embodiment, specifically a process for bonding a supporting base.

In step S106, as shown in FIG. 15A, the second substrate product SP2 has been prepared, and then a supporting product SPT is prepared. In the present example, the support product SPT is prepared as follows: a silicon wafer 69 is prepared; and a silicon oxide film 71 is grown on the silicon wafer 69. The silicon oxide film 71 may have a thickness, for example, in the range of 0.01 to 1 micrometer (10 nm).

Figure 15B:
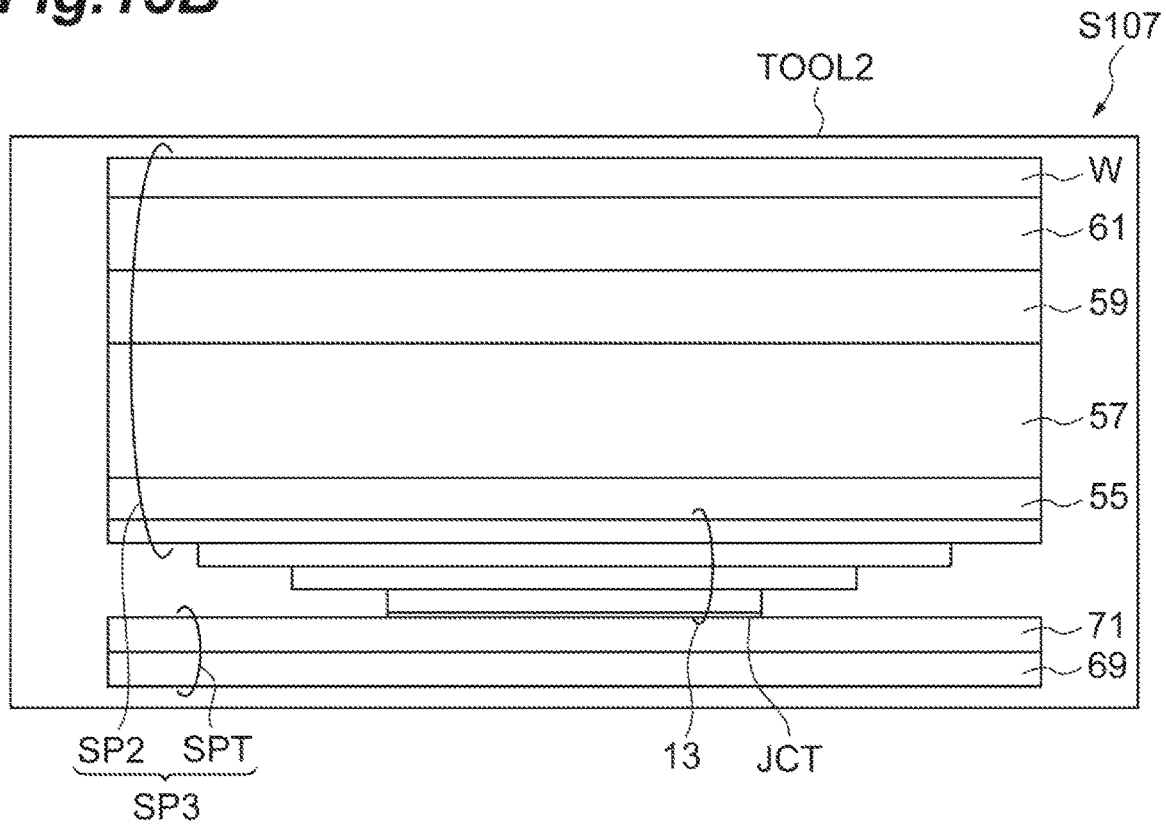
FIG. 15B is a schematic view showing major steps in the method of according to the embodiment, specifically a process for annealing the laminate thus bonded.

In step S107, as shown in FIG. 15B, the second substrate product SP2 is bonded to the supporting product SPT to produce the third substrate product SP3. Specifically, the uppermost layer of the optical filtering film 13 of the second substrate product SP2 is brought into contact with the silicon oxide film 71 of the supporting product SPT, and heat treatment is performed in the first device TOOL2 with the second substrate product SP2 and the supporting product SPT being pressed. The heat treatment is conducted at a temperature in the range of, for example, 100 to 350 degrees Celsius to form a bonding layer JCT, which bonds to the second substrate product SP2 to the supporting product SPT.

Figure 16A:
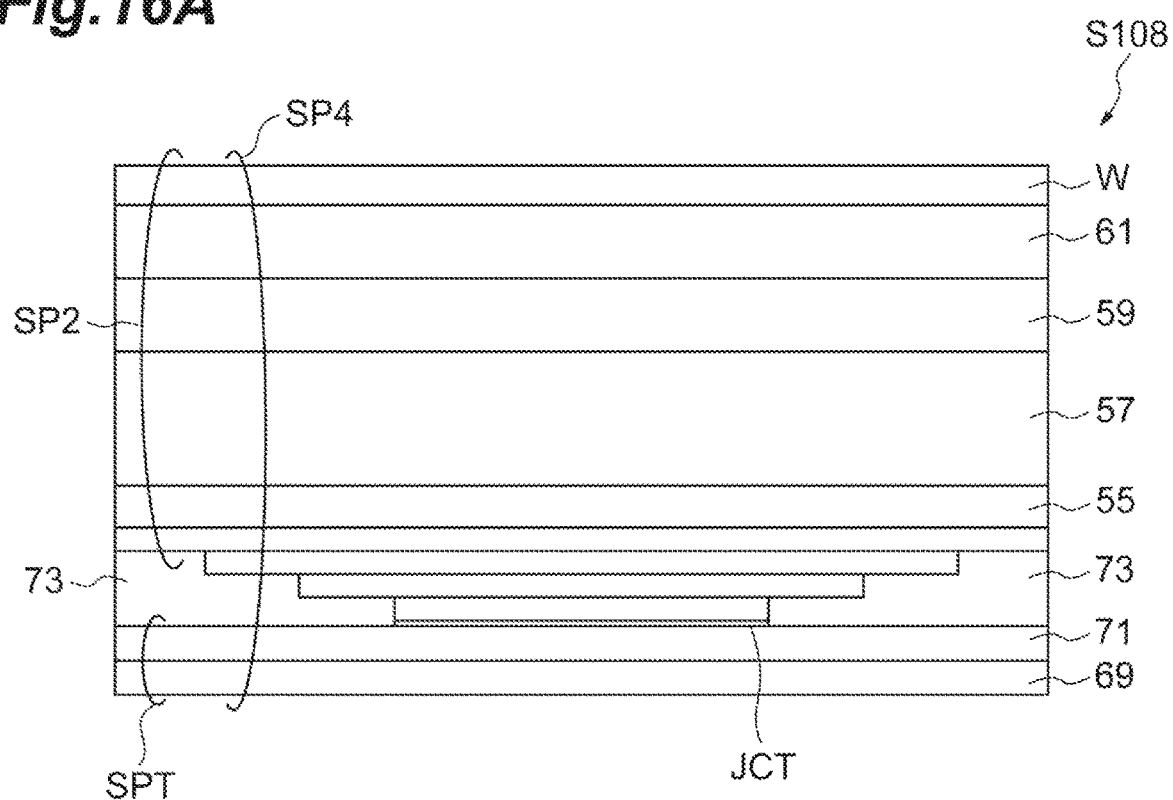
FIG. 16A is a schematic view showing a major step in the method of according to the embodiment, specifically a process for filling gaps with resin material.

In step S108, as shown in FIG. 16A, the third substrate product SP3 has a gap formed between the second substrate product SP2 and the support product SPT, and for example, a filler-containing epoxy resin 73 is injected to the gap to form a fourth substrate product SP4.

Figure 16B:
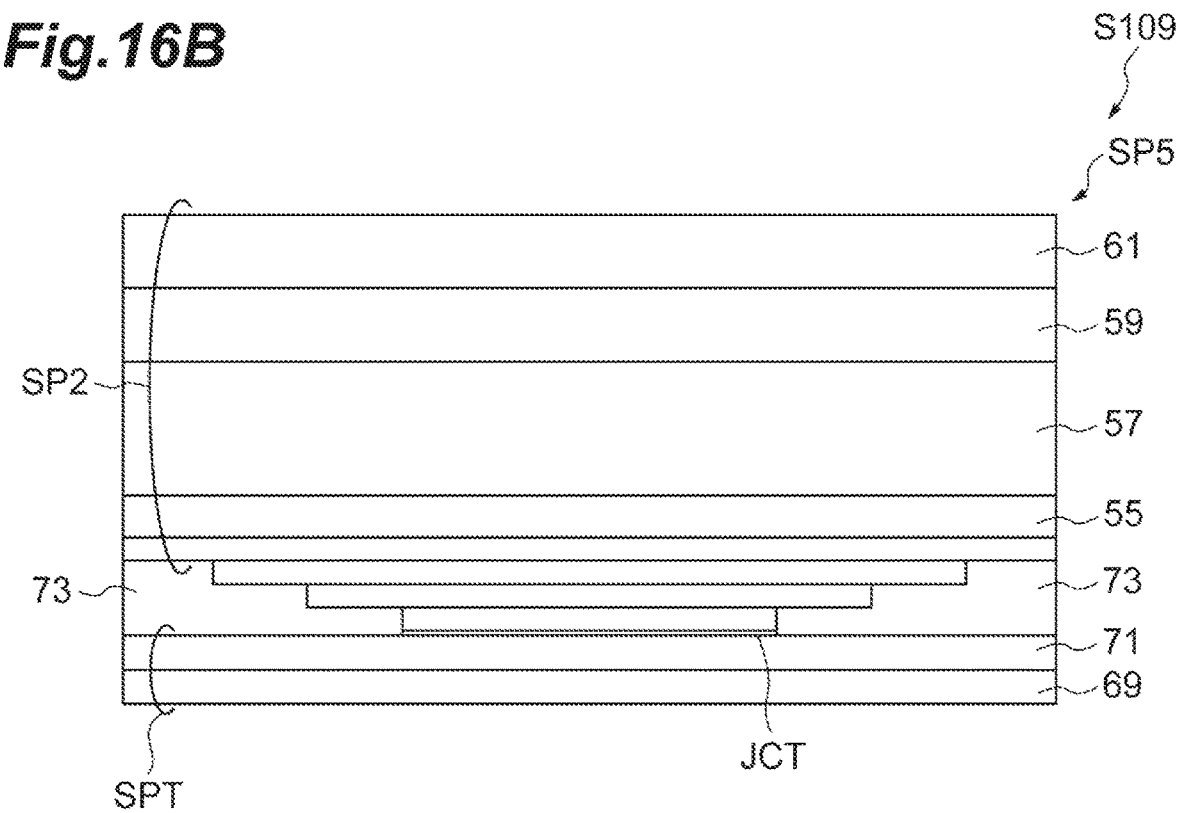
FIG. 16B is a schematic view showing a major step in the method of according to the embodiment, specifically a process for removing the carrier wafer.

In step S109, as shown in FIG. 16B, the wafer W is removed from the fourth substrate product SP 4 to form the fifth substrate product SP5. This removal uses, for example, a solvent suitable for the material used for adhesion, such as resin.

Figure 17A:
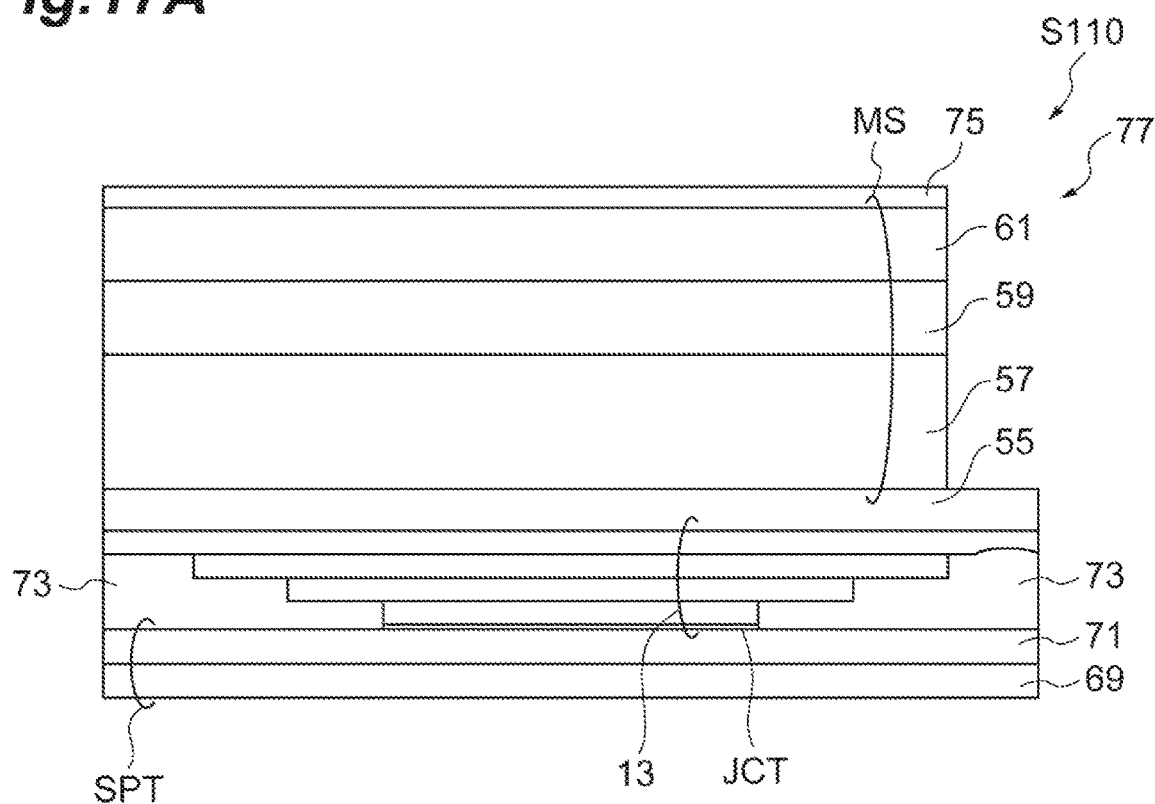
FIG. 17A is a schematic view showing a major step in the method of according to the embodiment, specifically a process for forming a photodiode structure.

In step S110, as shown in FIG. 17A, a mesa structure MS is formed. On the p-type InP layer 61, which is exposed by removing the wafer W, a mask 75 is formed which defines the shape of the mesa structure MS ,and the p-type InP layer 61, the InGaAs layer 59 and the light absorbing layer 57 are etched with this mask to form a groove 77 reaching the n-type InGaAs layer 55. The groove 77 defines the mesa structure MS for the photodiode structure 15.

Figure 17B:
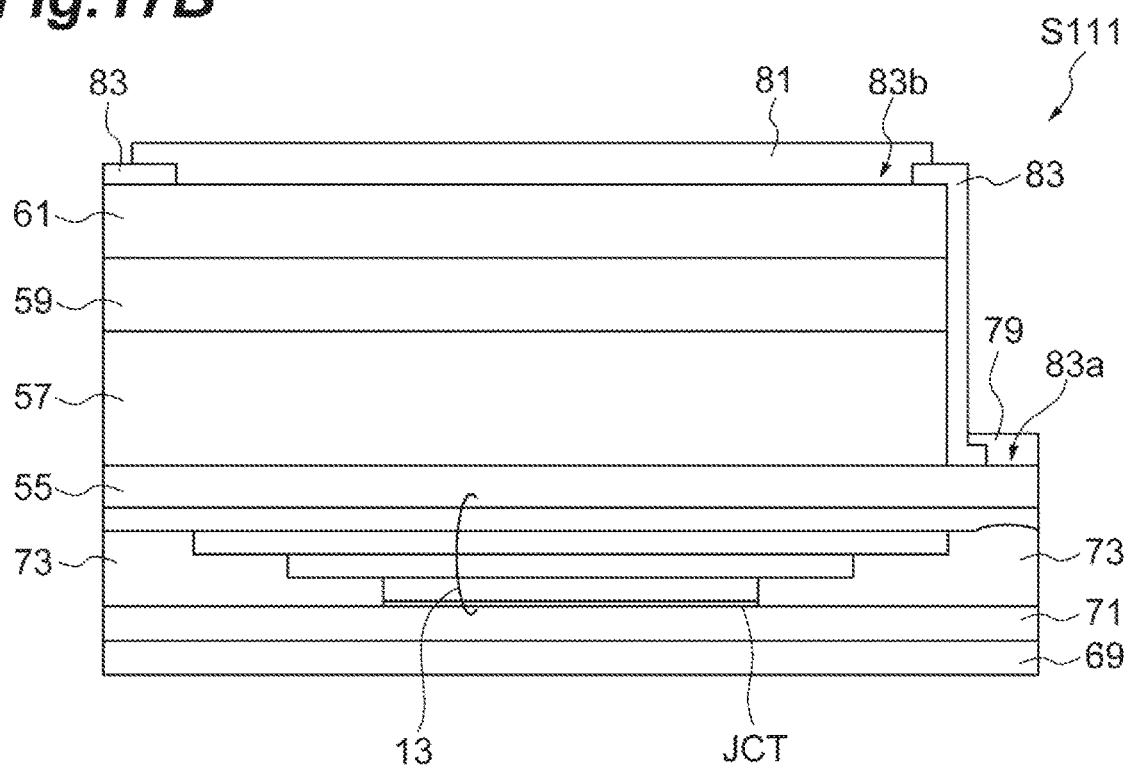
FIG. 17B is a schematic view showing a major step in the method of according to the embodiment, specifically a process for forming electrodes and passivation film on the photodiode structure.

In step S111, as shown in FIG. 17B, after the mesa structure MS is formed, a first electrode 79 is formed in contact with the n-type InGaAs layer 55, and a second electrode 81 is formed in contact with the p-type InP layer

61. Prior to the deposition of the metal films for these electrodes, a passivation film 83 is formed. The passivation film 83 can be, for example, a silicon oxide film. The passivation film 83 has a first opening 83*a* located on the n-type InGaAs layer 55 and a second opening 83*b* located in the p-type InP layer 61 for electrical connections.

These steps bring a product for the infrared sensing semiconductor device 10 to completion. This product is separated into a semiconductor chip of the infrared sensing semiconductor device 10.

As described above, the present embodiment can provide an infrared detecting semiconductor device including a filter enabling compensation for the optical response property of the light absorbing layer.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. An infrared detecting semiconductor device comprising:
    a supporting base transmissive to light in infrared wavelengths;
    a first conductivity-type semiconductor layer;
    a second conductivity-type semiconductor layer;
    an optical absorbing layer of type-II disposed between the first conductivity-type semiconductor layer and the second conductivity-type semiconductor layer; and
    an optical filtering film of n-type InGaAs having an n-type dopant concentration larger than $8 \times 10^{17}$ cm$^{-3}$,
    the optical absorbing layer, the optical filtering film, and the supporting base being sequentially arranged in a direction of a first axis,
    the optical filtering film including a first semiconductor region, a second semiconductor region, and a third semiconductor region, the first semiconductor region, the second semiconductor region, and the third semiconductor region being sequentially arranged in the direction of the first axis on the optical filtering film,
    the first semiconductor region having an n-type dopant concentration of $2.0 \times 10^{19}$ cm$^{-3}$ or more,
    the third semiconductor region having a n-type concentration of $3.0 \times 10^{18}$ cm$^{-3}$ or less,
    the second semiconductor region having a first dopant concentration at a boundary between the first semiconductor region and the second semiconductor region, and having a second dopant concentration at a boundary between the second semiconductor region and the third semiconductor region, and the first dopant concentration being greater than the second dopant concentration,
    the second semiconductor region including a part with an n-type dopant profile monotonically changing from the first dopant concentration to the second dopant concentration.

2. The infrared detecting semiconductor device according to claim 1, wherein
    the first semiconductor region, the second semiconductor region, and the third semiconductor region of the optical filtering film having a first cross-sectional area, a second cross-sectional area and a third cross-sectional area, respectively, the first cross-sectional area is greater than the second cross-sectional area, the second cross-sectional area is greater than the third cross-sectional area, and the first cross-sectional area, the second cross-sectional area and the third cross-sectional area each are defined on a plane intersecting the first axis.

3. The infrared detecting semiconductor device according to claim 1, wherein the optical absorbing layer having an InGaAs/GaAsSb quantum well structure.

4. The infrared detecting semiconductor device according to claim 1, further comprising:
    a first electrode in contact with the first conductivity-type semiconductor layer; and
    a second electrode in contact with the second conductivity-type semiconductor layer,
    wherein the optical filtering film is in direct contact with the first conductivity-type semiconductor layer.

5. The infrared detecting semiconductor device according to claim 1, wherein the first conductivity-type semiconductor layer includes an n-type InGaAs having an n-type dopant concentration of $8.0 \times 10^{17}$ cm$^{-3}$ or less.

* * * * *